United States Patent [19]

Ishihara et al.

[11] Patent Number: 4,818,564
[45] Date of Patent: Apr. 4, 1989

[54] METHOD FOR FORMING DEPOSITED FILM

[75] Inventors: Shunichi Ishihara, Ebina; Junichi Hanna; Isamu Shimizu, both of Yokohama, all of Japan

[73] Assignee: Canon Kabushiki Kaisha, Tokyo, Japan

[21] Appl. No.: 921,462

[22] Filed: Oct. 22, 1986

[30] Foreign Application Priority Data

| Oct. 23, 1985 | [JP] | Japan | 60-237006 |
| Oct. 24, 1985 | [JP] | Japan | 60-238497 |
| Dec. 28, 1985 | [JP] | Japan | 60-298046 |

[51] Int. Cl.⁴ ............ B05D 5/06; B05D 5/12; C23C 16/00
[52] U.S. Cl. .................... 427/69; 427/70; 427/255; 427/255.1; 427/255.2; 437/225
[58] Field of Search ......... 427/69, 70, 255.3, 255, 427/95, 87, 86, 255.1, 85, 248.1, 255.2, 250, 252; 437/225, 233, 234, 235, 243

[56] References Cited

U.S. PATENT DOCUMENTS

| Re. 31,708 | 10/1984 | Gordon | 427/255.3 |
| 3,473,978 | 10/1969 | Jackson et al. | 148/175 |
| 3,888,705 | 6/1975 | Fletcher et al. | 148/175 |
| 4,146,657 | 3/1979 | Gordon | 427/255.3 |
| 4,239,811 | 12/1980 | Kemlage | 427/255.3 |
| 4,357,179 | 11/1982 | Adams et al. | 427/95 |
| 4,402,762 | 9/1983 | John et al. | 427/87 |
| 4,421,592 | 12/1983 | Shuskus et al. | 156/613 |
| 4,448,801 | 5/1984 | Fukuda et al. | 427/87 |
| 4,462,847 | 7/1984 | Thompson et al. | 148/174 |
| 4,504,518 | 3/1985 | Dushinsky et al. | 427/86 |
| 4,522,663 | 6/1985 | Dushinsky et al. | 427/86 |
| 4,554,180 | 11/1985 | Hirooka | 427/248.1 |
| 4,615,905 | 10/1986 | Dushinsky et al. | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/87 |
| 4,652,463 | 3/1987 | Peters | 427/255.3 |
| 4,657,777 | 4/1987 | Hirooka | 427/39 |
| 4,689,093 | 8/1987 | Ishihara et al. | 437/5 |

FOREIGN PATENT DOCUMENTS

| 30638 | 6/1981 | European Pat. Off. . |
| 74212 | 3/1983 | European Pat. Off. . |
| 90586A | 10/1983 | European Pat. Off. . |
| 104907 | 4/1984 | European Pat. Off. . |
| 59-199035 | 12/1984 | Japan . |
| 60-43819 | 8/1985 | Japan . |
| 2038086 | 7/1980 | United Kingdom | 427/87 |
| 2148328 | 5/1985 | United Kingdom | 427/255.2 |

OTHER PUBLICATIONS

Ohnishi et al., Proceedings, 6th E.C. Photovoltaic Solar Energy Conference, London, Apr. 15–19, 1985.
Sakai et al., Proceedings, 6th E.C. Photovoltaic Solar Energy Conference, London, Apr. 15–19, 1985.
Brodsky, et al., 22 IBM Technical Disclosure Bulletin 3391 (Jan. 1980).
Inoue, Appl. Phys. Lett. 43(8), 15 Oct. 83, p. 774.

Primary Examiner—Sadie Childs
Attorney, Agent, or Firm—Fitzpatrick, Cella, Harper & Scinto

[57] ABSTRACT

A method for forming a deposited film comprises introducing a gaseous starting material for formation of a deposited film and a gaseous halogenic oxidizing agent having the property of oxidation action for said starting material into a reaction space to effect chemical contact therebetween to thereby form a plural number of precursors containing precursors under excited state, and forming a deposited film on a substrate existing in the film forming space with the use of at least one precursor of these precursors as the feeding source for the constituent element of the deposited film.

42 Claims, 2 Drawing Sheets

METHOD FOR FORMING DEPOSITED FILM

BACKGROUND OF THE INVENTION

1. Field of the Invention

This invention relates to a method for formation of a functional film, particularly a functional deposited film which is useful for uses such as semiconductor devices, photosensitive devices for electrophotography, electronic devices such as optical input sensor devices for optical image inputting devices, etc.

2. Related Background Art

In the prior art, for amorphous or polycrystalline functional films such as semiconductor films, insulating films, photoconductive films, magnetic films or metal films, individually suitable film forming methods have been employed from the standpoint of desired physical characteristics, uses, etc.

For example, for formation of silicon deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H,X)" when indicating a polycrystalline silicon) (the so-called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon deposited film according to the plasma CVD method which has been generalized in the prior art is considerably complicated as compared with the CVD method of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By use of such a large number of parameters, the plasma may sometimes become unstable, whereby marked deleterious influences were exerted frequently on the deposited film formed. Besides, the parameters characteristic of the device must be selected for each device and therefore under the present situation it has been difficult to generalize the production conditions.

On the other hand, for the silicon deposited film to exhibit sufficiently satisfactory electric and optical characteristics for respective uses, it is now accepted the best to form it according to the plasma CVD method.

However, depending on the application use of the silicon deposited film, bulk production with reproducibility must be attempted with full satisfaction of enlargement of area, uniformity of film thickness as well as uniformity of film quality, and therefore in formation of a silicon deposited film according to the plasma CVD method, enormous installation investment is required for a bulk production device and also management items for such bulk production become complicated, with a width of management tolerance being narrow and the control of the device being severe. These are pointed as the problems to be improved in the future.

Also, in the case of the plasma CVD method, since plasma is directly generated by high frequency or microwave, etc., in the film forming space in which a substrate on which film is formed is arranged, electrons or a number of ion species generated may damage to the film in the film forming process to cause lowering in film quality or non-uniformization of film quality.

As an improvement of this point, the indirect plasma CVD method has been proposed.

The indirect plasma CVD method has been elaborated to use selectively the effective chemical species for film formation by forming plasma by microwave, etc., at an upstream position apart from the film forming space and transporting the plasma to the film forming space.

However, even by such a plasma CVD method, transport of plasma is essentially required and therefore the chemical species effective for film formation must have long life, whereby the gas species which can be employed are spontaneously limited, thus failing to give various deposited films. Also, enormous energy is required for generation of plasma, and generation of the chemical species effective for film formation and their amounts cannot be essentially placed under simple management. Thus, various problems remain to be unsolved.

As contrasted to the plasma CVD method, the optical CVD method is advantageous in that no ion species or electrons are generated which damage to the film quality during film formation. However, there are problems such that the light source does not include so many types, that the wavelength of the light source tends to be toward UV side, that a large scale light source and its power source are required in the case of industrialization, that the window for permitting the light from the light source to be introduced into the film forming space is coated with a film during film formation to result in lowering in dose during film formation, which may further lead to shut-down of the light from the light source into the film forming space.

As described above, in formation of silicon deposited film, the points to be solved still remain, and it has been earnestly desired to develop a method for forming a deposited film which is capable of bulk production by attempting to effect energy saving by means of a device of low cost, while maintaining the characteristics as well as uniformity which are practically available. These are also applicable for other functional films such as silicon nitride films, silicon carbide films, silicon oxide films as the similar problems which should be solved respectively.

SUMMARY OF THE INVENTION

An object of the present invention is to remove the drawbacks of the method for forming deposited films as described above and at the same time to provide a novel method for forming a deposited film without use of the formation method of the prior art.

Another object of the present invention is to provide a method for forming a deposited film capable of effecting energy saving and at the same time obtaining a deposited film with uniform characteristics over a large area with easy management of film quality.

Still another object of the present invention is to provide a method for forming a deposited film by which a film excellent in productivity and bulk productivity, having high quality as well as excellent physical characteristics such as electrical, optical and semiconductor characteristics can be easily obtained.

According to the first aspect of the present invention, there is provided a method for forming a deposited film, which comprises introducing a gaseous starting material for formation of a deposited film and a gaseous halogenic oxidizing agent having the property of an oxidation action for said starting material into a reaction space to effect chemical contact therebetween to thereby form a plural number of precursors containing precursors under excited state, and forming a deposited film on a substrate existing in the film forming space with the use of at least one precursor of these precursors as the feeding source for the constituent element of the deposited film.

According to the second aspect of the present invention, there is provided a method for forming a deposited film, which comprises introducing a gaseous starting material for formation of a deposited film, a gaseous halogenic oxidizing agent having the property of oxidation action for said starting material and a gaseous material (D) containing a component for valence electron controller as the constituent into a reaction space to effect chemical contact therebetween to thereby form a plural number of precursors containing precursors under excited state, and forming a deposited film on a substrate existing in the film forming space with the use of at least one precursor of these precursors as the feeding source for the constituent element of the deposited film.

According to the third aspect of the present invention, there is provided a method for forming a deposited film, which comprises introducing a gaseous starting material for formation of a deposited film and a gaseous halogenic oxidizing agent having the property of an oxidation action for said starting material into a reaction space to effect chemical contact therebetween to thereby cause a chemical reaction accompanied with luminescence to occur and form a plural number of precursors containing precursors under excited state, setting a substrate to be positioned in the region with a luminescence intensity not greater than 1/5 of the maximum intensity of the above luminescence and forming a deposited film on a substrate existing in the film forming space with the use of at least one precursor of these precursors as the feeding source for the constituent element of the deposited film.

DESCRIPTION OF THE PREFERRED EMBODIMENTS

Figure 1:
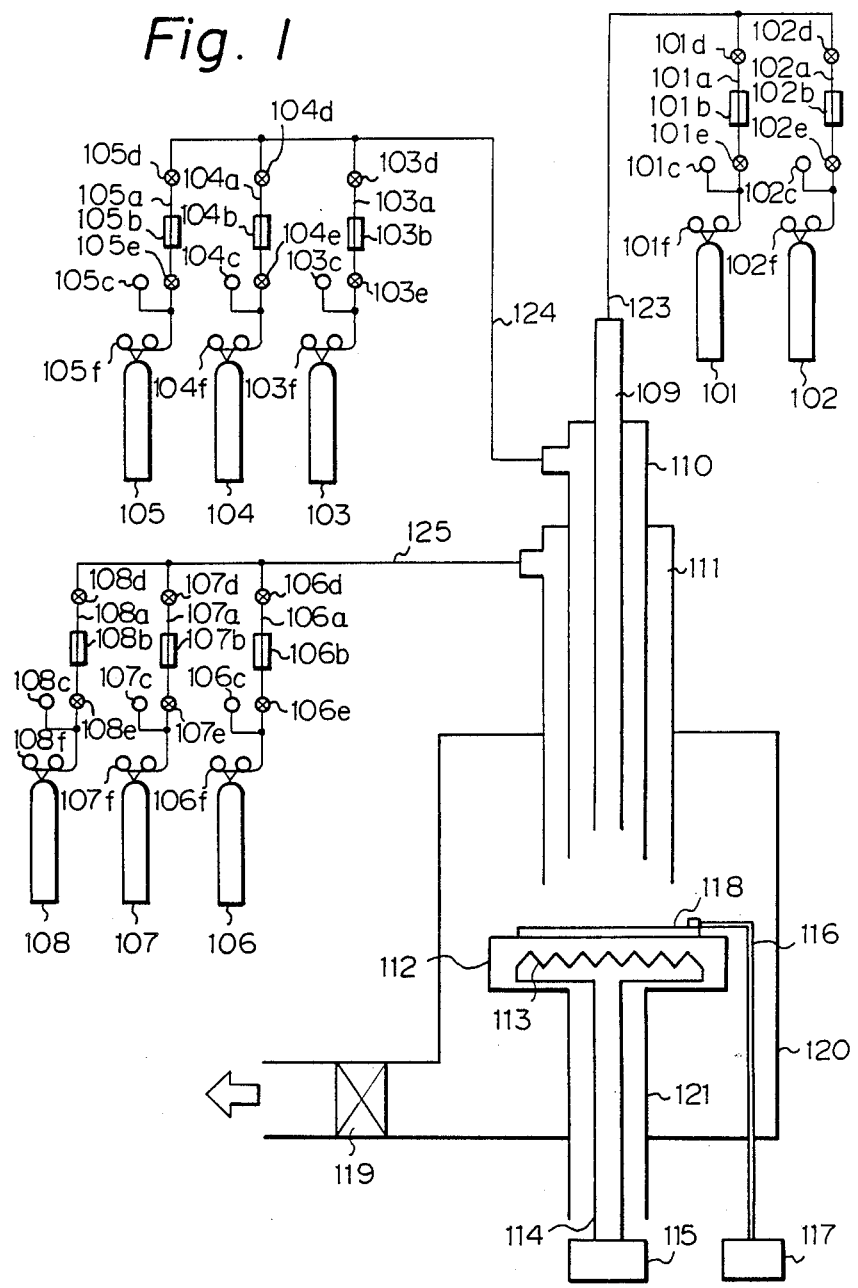
FIG. 1 is a schematic illustration of a deposited film forming device used in Examples of the present invention.

In the method for forming a deposited film of the present invention, the gaseous starting material to be used for formation of a deposited film receives oxidizing action through chemical contact with a gaseous halogenic oxidizing agent and can be selected suitably as desired depending on the kind, the characteristic, use, etc., of the desired deposited film.

In the method for forming a deposited film of the present invention, the gaseous material (D) containing a component for a valence electron controller as the constituent which is used as desired receives oxidizing action through chemical contact with a gaseous halogenic oxidizing agent and can be selected suitably as desired depending on the kind, the characteristic, use, etc., of the desired deposited film. In the present invention, the above gaseous starting material, the gaseous material (D) and the gaseous halogenic oxidizing agent may be those which can be made gaseous during chemical contact, and they can be either liquid or solid as ordinary state.

When the starting material for formation of a deposited film, the material (D) or a halogenic oxidizing agent is under ordinary state, the starting material for formation of a deposited film, the material (D) and the halogenic oxidizing agent are introduced in gaseous state into the reaction space while performing bubbling with the use of carrier gas such as Ar, He, $N_2$, $H_2$, etc., optionally with application of heat.

During this operation, the partial pressures and mixing ratio of the above gaseous starting material, the gaseous material (D) and the gaseous halogenic oxidizing agent may be set by controlling the flow rate of the carrier gas and the vapor pressures of the starting material for formation of the deposited film and the gaseous halogenic oxidizing agent.

As the starting material for formation of a deposited film to be used in the present invention, for example, if tetrahedral type deposited films such as semiconductive silicon type deposited films or germanium type deposited films, etc., are desired to be obtained, straight chain and branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, and examples of chain germanium compounds include $Ge_mH_{2m+2}$ (m=1, 2, 3, 4, 5), etc. In addition to these compounds, for example, hydrogenated tin such as $SnH_4$, etc., may be employed together as the starting material for formation of a deposited film.

Of course, these silicon type compounds and germanium type compounds may be used either as a single kind or as a mixture of two or more kinds.

The halogenic oxidizing agent to be used in the present invention is gaseous when introduced into the reaction space and at the same time has the property of effectively oxidizing the gaseous starting material for formation of a deposited film introduced into the reaction space by mere chemical contact therewith, including halogen gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material for formation of a deposited film and the above material (D) as described above with desired flow rate and feeding pressure given, wherein they are mixed with and collided against the above starting material and the above material (D) to be chemically contacted therewith, thereby oxidizing the above starting material and the above material (D) to generate efficiently plural kinds of precursors containing precursors under excited state. Of the precursors under excited state and other precursors generated, at least one of them function as the feeding source for the constituent element of the deposited film formed.

The precursors generated may undergo decomposition or reaction to be converted precursors under excited state or to precursors under another excited state, or alternatively in their original forms, if desired, although releasing energy to contact the substrate surface arranged in a film forming space, whereby a deposited film with a three-dimensional network structure is formed.

The energy level excited is preferably such that energy transition of the precursor in the above excited state to a lower energy level or the process of change of the precursor in the above excited state to another chemical species is accompanied with luminescence. By formation of an activated precursor including the precursor under excited state accompanied with luminescence in such a transition of energy, the deposited film forming process of the present invention proceeds with better efficiency and more energy saving to form a deposited film having uniform and better physical characteristics over the whole film surface.

In the method of the present invention, as the material (D) containing a component for a valence electron controller as the constituent which is optionally used as desired, it is preferable to select a compound which is in gaseous state under normal temperature and normal pressure, or a gas or suitably gasifiable by means of a suitable gasifying device under the conditions for forming a deposited film.

As the material (D) to be used in the present invention, in the case of a silicon type semiconductor film and a germanium type semiconductor film, there may be employed compounds containing the p type valence electron controller, which functions as the so called p type impurity, namely an element of the group IIIA of the periodic table such as B, Al, Ga, In, Tl, etc., and the n type valence electron controller which functions as the so called n type impurity, namely an element of the group VA of the periodic table such as N, P, As, Sb, Bi, etc.

Specific examples may include $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc., as effective ones.

For introducing the gas of the above material (D) into the reaction space, it can be previously mixed with the above starting material for formation of a deposited film before introduction, or it can be introduced from independent plural number of gas feeding sources.

In the present invention, so that the deposited film forming process may proceed smoothly to form a film of high quality and having desired physical characteristics, as the film forming factors, the kinds and combination of the starting material for formation of a deposited film and the material (D) and the halogenic oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as desired in relationship of the film forming factors related among the film forming factors as mentioned above, but it is preferably 1/100 to 100/1, more preferably 1/50–50/1 in terms of flow rate ratio introduced.

The proportion of the gaseous material (D) may be set suitably as desired depending on the kind of the above gaseous starting material and the desired semiconductor characteristics of the deposited film to be prepared, but it is preferably 1/1000000 to 1/10, more preferably 1/100000 to 1/20, optimally 1/100000 to 1/50 based on the above gaseous starting material.

The pressure during mixing when introduced into the reaction space may be preferably higher in order to enhance the chemical contact between the above gaseous starting material, the gaseous material (D) and the above gaseous halogenic oxidizing agent in probability, but it is better to determine the optimum value suitably as desired in view of the reactivity. Although the pressure during mixing may be determined as described above, each of the pressure during introduction may be preferably $1 \times 10^{-7}$ atm to 10 atm, more preferably $1 \times 10^{-6}$ atm to 3 atm.

The pressure within the film forming space, namely the pressure in the space in which the substrate on which surfaces are effected film formation. is arranged may be set suitably as desired so that the precursors (E) under excited state generated in the reaction space and sometimes the precursors (F) formed as secondary products from the precursors (E) may contribute effectively to film formation.

The inner pressure in the film forming space, when the film forming space is continuous openly to the reaction space, can be controlled in relationship with the introduction pressures and flow rates of the gaseous starting material for formation of a deposited film, the above material (D) and the gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only different in space, it is possible to effect differential evacuation or provide a large scale evacuating device having sufficient evacuating capacity as described above.

As described above, the pressure in the film forming space may be determined in the relationship with the introduction pressures of the gaseous starting material, the gaseous material (D) and the gaseous halogenic oxidizing agent introduced into the reaction space, but it is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate and the gas evacuating outlet so that the starting material for formation of a deposited film, the material (D) and the halogenic oxidizing agent may be efficiently mixed during introduction of these into the reaction space, the above precursors (E) may be efficiently generated and film formation may be adequately done without trouble.

A preferable example of the geometric arrangement is shown in FIG. 1.

As the substrate temperature (Ts) during film formation, it can be set suitably as desired individually depending on the gas species employed and the kinds and the required characteristics of the deposited film formed, but, in the case of obtaining an amorphous film, it is preferably from room temperature to 450° C., more preferably from 50° to 400° C. Particularly, in the case of forming a silicon deposited film with better semiconductor characteristics and photoconductive characteristics, etc., the substrate temperature (Ts) should desirably be made 70° to 350° C. On the other hand, in the case obtaining a polycrystalline film, it should preferably be 200° to 650° C., more preferably 300° to 600° C.

As the atmosphere temperature (Tat) in the film forming space, it may be determined suitably as desired in relationship with the substrate (Ts) temperature so that the above precursors (E) generated and the above precursors (F) are not changed to unsuitable chemical species for film formation, and also the above precursors (E) may be efficiently generated.

In the method for forming a deposited film according to the present invention, strong chemical luminescence is observed at least in a certain region including the position where the gaseous starting material and the gaseous halogenic oxidizing agent are mixed. When the region exhibiting luminescence with an intensity of 1/5 or more of the maximum intensity of luminescence is defined as the luminescent region (A), and the region other than the luminescent region (A) is defined as the non-luminescent region (B), in the preferred embodiment of the present invention, the above-mentioned substrate for film formation is placed within the non-luminescent region (B). The size and the shape of the luminescent region (A) will vary depending on the flow rate of the gaseous starting material, the flow rate of the gaseous halogenic oxidizing agent, the inner pressure in the film forming space and the inner dimensions and the inner shape of the device, etc. This luminescence, when using, for example, a starting material containing Si and a halogenic oxidizing agent containing F, was confirmed to be based primarily on SiF*.

In the preferred embodiment of the present invention, since the substrate is arranged on the above non-luminescent region (B) in the film forming space, as compared with thermal CVD method, for example, even the substrate temperature may be a low temperature of about 80° to 230° C. in film formation of A-Si (H,X), a relatively great deposition speed of 10 to 50 Å/sec can be obtained, and the physical characteristics of the film are also good in spite of such a high speed film formation. In this connection, if the substrate is arranged on the above luminescent region (A) in the film forming space, only a relatively small deposition speed of 1 to 2 Å/sec can be obtianed.

In the present invention, when the substrate for film formation is placed within the above-mentioned non-luminescent region (B), the ratio of the gaseous starting material for formation of a deposited film and the gaseous halogenic oxidizing agent introduced into the reaction space may be determined suitably as desidred in relationship of the film forming factors related among the film forming factors as mentioned above, but it is preferably 1/20 to 20/1, more preferably 1/5 to 5/1 in terms of flow rate ratio introduced.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd, etc. or alloys thereof.

As insulating substrates, there may be conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within the film to give sometimes no film of good quality, and therefore it is preferable to use a substrate so that the difference in thermal expansion between both is small.

Also, the surface state of the substrate is directly related to the structure of the film (orientation) or generation of stylet structures, and therefore it is desirable to treat the surface of the substrate to give a film structure and a film texture so that desired characteristics may be obtained.

FIG. 1 shows an example of a preferable device for practicing the method for forming a deposited film of the present invention.

The deposited film forming device shown in FIG. 1 is broadly classified into a main device, an evacuation system and a gas feeding system.

In the main device, a reaction space and a film forming space are provided.

101 ∝ 108 are respectively bombs filled with the gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of the pipeline. The pipeline for gas introduction has a triple concentric arrangement structure, having from the innerside a first gas introducing pipe 109 for introducing the gases from the gas bombs 101 and 102, a second gas introducing pipe 110 for introducing the gases from the gas bombs 103–105, and a third gas introducing pipe 111 for introducing the gases from the gas bombs 106–108.

For gas introduction to the reaction space from each gas introducing pipe, its position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

The respective gas introducing pipes, the respective gas feeding pipelines and the vacuum chamber 120 are evacuated to vacuum through the main vacuum valve 119 by means of a vacuum evacuating device not shown.

The substrate 118 is set at a suitable desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc., but is is preferably several mm to 20 cm, more preferably 5 mm to about 15 cm.

113 is a heater for heating the substrate which is provided in order to heat the substrate to an appropriate temperature during film formation, or preheating the substrate 118 before film formation, or further to anneal the film after film formation.

The substrate heating heater 113 is supplied with power through a conductive wire 114 from a power source 115.

116 is a thermocouple for measuring the temperature of the substrate (Ts) and is electrically connected to the temperature display device 117.

The present invention described in more detail by referring to the following Examples.

EXAMPLE 1

By use of the film forming device shown in FIG. 1, a deposited film was prepared according to the process of the present invention as described below.

The $SiH_4$ gas filled in the bomb 103 was introduced at a flow rate of 20 sccm, the $B_2H_6$ gas (diluted with $H_2$ gas to 1%) filled in the bomb 104 at a flow rate of 2 sccm through the gas introducing pipe 110, the $F_2$ gas filled in the bomb 106 at a flow rate of 2 sccm and the He gas filled in the bomb 108 at a flow rate of 40 sccm through the gas introducing pipe 111 into the vacuum chamber 120.

During this operation, the pressure in the vacuum chamber 120 was made 800 mTorr by controlling the opening of the vacuum valve 119. A quartz glass (15 cm × 15 cm) was used for the substrate, and the distance between the gas introducing inlet 111 and the substrate was set at 3 cm. Blueish white luminescence was strongly observed in the mixing region of $SiH_4$ gas and $F_2$ gas. The substrate temperature (Ts) was set at from room temperature to 400° C. for respective samples as indicated in Table A-1.

When gases were permitted to flow under such conditions for 3 hours, Si:H:F:B films with film thicknesses as shown in Table A-1 were deposited on the substrate.

The distribution irregularity of the film thickness was within ±5%. Every sample of the Si:H:F:B film formed was confirmed to be amorphous by electron beam diffraction.

On the amorphous Si:H:F:B film of each sample, a comb-shaped electron (gap length 200 μm) of aluminum was vapor deposited to prepare a sample for measurement of electroconductivity. Each sample was placed in a cryostat, a voltage of 100 V was applied and the current was measured by a micro-amperemeter (YHP4140B) to determine the dark electroconductivity ($\sigma d$). Also, light of 600 nm and 0.3 mw/cm² was irradiated to determine the photoconductivity ($\sigma p$). Further, from absorption of light, the optical band gap ($Eg^{opt}$) was determined. These results are shown in Table A-1. Moreover, all of these films exhibited P-type conduction by measurement of thermal electromotive force.

TABLE A-1

| Sample No. | 1-1 | 1-2 | 1-3 | 1-4 | 1-5 |
|---|---|---|---|---|---|
| Substrate temperature (°C.) | 28 | 120 | 200 | 300 | 400 |
| Film thickness (μm) | 2.6 | 2.4 | 2.0 | 1.6 | 1.6 |
| $\sigma d$ (S/cm) | $4 \times 10^{-8}$ | $3 \times 10^{-8}$ | $7 \times 10^{-8}$ | $2 \times 10^{-8}$ | $5 \times 10^{-8}$ |
| $\sigma p$ (S/cm) | $2 \times 10^{-7}$ | $9 \times 10^{-8}$ | $3 \times 10^{-7}$ | $5 \times 10^{-7}$ | $4 \times 10^{-7}$ |
| $Eg^{opt}$ (eV) | 2.1 | 1.8 | 1.7 | 1.7 | 1.6 |

Next, when the substrate temperature was fixed at 300° C., and the flow rate of $SiH_4$ was varied, the respective samples prepared were found to give the results of film thickness, $\sigma d$, $\sigma p$ and $Eg^{opt}$ as shown in Table A-2.

The gas was flowed for 3 hours for each sample, and the $F_2$ gas flow rate was made 2 sccm, and the He gas flow rate 40 sccm and the inner pressure 800 mTorr for each example.

TABLE A-2

| Sample No. | 1-6 | 1-7 | 1-8 | 1-9 | 1-10 |
|---|---|---|---|---|---|
| $SiH_4$ Flow rate (sccm) | 5 | 10 | 20 | 40 | 80 |
| Film thickness (μm) | 0.9 | 1.1 | 1.6 | 2.2 | 2.4 |
| $\sigma d$ (S/cm) | $4 \times 10^{-8}$ | $5 \times 10^{-8}$ | $2 \times 10^{-8}$ | $1 \times 10^{-8}$ | $9 \times 10^{-9}$ |
| $\sigma p$ (S/cm) | $5 \times 10^{-8}$ | $8 \times 10^{-8}$ | $5 \times 10^{-7}$ | $4 \times 10^{-7}$ | $2 \times 10^{-7}$ |
| $Eg^{opt}$ (eV) | 1.7 | 1.7 | 1.7 | 1.6 | 1.7 |

Next, the substrate temperature was set at 300° C., $SiH_4$ gas flow rate at 20 sccm, $F_2$ gas flow rate at 2 sccm, the $B_2H_6$ gas flow rate (diluted with $H_2$ gas to 1%) at 2 sccm and the inner pressure at 800 mTorr, and the He gas flow rate was varied variously. The respective samples obtained after flowing the respective gases for 3 hours were found to have the film thickness and values of $\sigma d$, $\sigma p$ and $Eg^{opt}$ as shown in Table A-3.

TABLE A-3

| Sample No. | 1-11 | 1-12 | 1-13 | 1-14 | 1-15 | 1-16 |
|---|---|---|---|---|---|---|
| He Flow rate (sccm) | 0 | 5 | 10 | 20 | 40 | 80 |
| Film thickness (μm) | 0.5 | 0.8 | 1.3 | 1.5 | 1.6 | 1.6 |
| $\sigma d$ (S/cm) | $4 \times$ | $3 \times$ | $6 \times$ | $7 \times 10^{-8}$ | $2 \times$ | $1 \times 10^{-8}$ |

TABLE A-3-continued

| Sample No. | 1-11 | 1-12 | 1-13 | 1-14 | 1-15 | 1-16 |
|---|---|---|---|---|---|---|
| $\sigma p$ (S/cm) | $10^{-8}$ $1 \times 10^{-7}$ | $10^{-8}$ $2 \times 10^{-7}$ | $10^{-8}$ $5 \times 10^{-7}$ | $4 \times 10^{-7}$ | $10^{-8}$ $5 \times 10^{-7}$ | $8 \times 10^{-7}$ |
| $Eg^{opt}$ (eV) | 1.6 | 1.7 | 1.6 | 1.6 | 1.7 | 1.6 |

Next, the substrate temperature was set at 300° C., SiH$_4$ gas flow rate at 20 sccm, F$_2$ gas flow rate at 2 sccm, B$_2$H$_6$ gas (diluted with H$_2$ gas to 1%) flow rate at 2 sccm and He gas flow rate at 40 sccm, and the inner pressure was varied variously. The respective samples obtained were found to have the film thickness and values of $\sigma d$, $\sigma p$ and $Eg^{opt}$ as shown in Table A-4.

TABLE A-4

| Sample No. | 1-17 | 1-18 | 1-19 | 1-20 | 1-21 |
|---|---|---|---|---|---|
| Inner pressure | 10 mTorr | 100 mTorr | 1 Torr | 10 Torr | 100 Torr |
| Film thickness ($\mu$m) | 0.8 | 1.6 | 1.9 | 1.1 | 0.7 |
| $\sigma d$ (S/cm) | $5 \times 10^{-8}$ | $2 \times 10^{-8}$ | $4 \times 10^{-8}$ | $1 \times 10^{-8}$ | $7 \times 10^{-9}$ |
| $\sigma p$ (S/cm) | $4 \times 10^{-7}$ | $5 \times 10^{-7}$ | $3 \times 10^{-6}$ | $2 \times 10^{-7}$ | $1 \times 10^{-7}$ |
| $Eg^{opt}$ (eV) | 1.6 | 1.7 | 1.6 | 1.6 | 1.7 |

All of the respective samples shown in Table A-2–Table A-4 exhibited P-type conduction by measurement of thermal electromotive force.

The distribution irregularity of the film thickness of the respective samples shown in Table A-1 to Table A-4 was found to be dependent on the distance between the gas introducing pipe 111 and the substrate, the gas flow rates flowed through the gas introducing pipes 110 and 111 and the inner pressure. In each film formation, the distribution irregularity of film thickness could be controlled within ±5% in the substrate of 15 cm×15 cm by controlling the distance between the gas introducing pipe and the substrate. This position was found to correspond to the position of the maximum luminescence intensity in most cases. Moreover, the Si:H:F:B film formed in every sample was confirmed to be amorphous from the result of electron beam diffraction.

EXAMPLE 2

Film formation was conducted by introducing Cl$_2$ gas from the 107 bomb simultaneously with introduction of F$_2$ gas in Example 1 (Sample 2A).

The film forming conditions in this case are as follows:

| | |
|---|---|
| SiH$_4$ | 20 sccm |
| F$_2$ | 2 sccm |
| Cl$_2$ | 2 sccm |
| B$_2$H$_6$(1% H$_2$ dilution) | 2 sccm |
| He | 40 sccm |
| Inner pressure | 800 mTorr |
| Substrate temperature | 300° C. |
| Distance between gas blowing outlet and substrate | 3 cm |

Similarly as in Example 1, strong blue luminescence was observed in the region where SiH$_4$ gas and (F$_2$+Cl$_2$) gas are merged into one stream.

After gas blowing for 3 hours, an A-Si:H:F:Cl:B film with a thickness of about 2.6 $\mu$m was deposited on the quartz glass substrate.

This film was found to be amorphous as confirmed by electron beam diffraction.

After an aluminum comb-shaped electrode (gap length 200 $\mu$m) was vapor deposited in vacuo on the A-Si:H:F:Cl:B film, the sample was placed in a vacuum cryostat, and dark electroconductivity ($\sigma d$), electroconductivity ($\sigma p$) when irradiated with light of 600 nm and 0.3 mw/cm$^2$ and the optical band gas ($Eg^{opt}$) by measurement of optical absorption were measured, respectively.

The obtained values were as follows:

$\sigma d = 3 \times 10^{-8}$ s/cm $\sigma p = 7 \times 10^{-7}$ s/cm $Eg^{opt} = 1.75$ eV Moreover, the result of measurement of thermal electromotive force exhibited P-type.

EXAMPLE 3

In Example 1, film formation was conducted by introducing Si$_2$H$_6$ gas from the 105 bomb in place of introducing SiH$_4$ gas (Sample 3A).

The film forming conditions in this case are as follows:

| | |
|---|---|
| Si$_2$H$_6$ | 20 sccm |
| F$_2$ | 5 sccm |
| B$_2$H$_6$ (1% H$_2$ dilution) | 2 sccm |
| He | 40 sccm |
| Inner pressure | 800 mTorr |
| Substrate temperature | 300° C. |
| Distance between gas blowing outlet and substrate | 3 cm |

In the region where Si$_2$H$_6$ gas and F$_2$ gas were merged into one stream, strong blue luminescence was observed. After gas blowing for 1 hour, an A-Si:H:F:B film with a thickness of about 1.9 $\mu$m was deposited on the quartz glass substrate.

This film was confirmed to be amorphous by electron beam diffraction.

After an aluminum comb-shaped electrode (gap length 200 $\mu$m) was vapor deposited in vacuo on the A-Si:H:F:B film, the sample was placed in a vacuum cryostat, and dark electroconductivity ($\sigma d$), electroconductivity ($\sigma p$) when irradiated with light of 600 nm and 0.3 mw/cm$^2$ and the optical band gap ($Eg^{opt}$) by measurement of optical absorption were measured, respectively.

The obtained values were as follows:

$\sigma d = 8 \times 10^{-8}$ s/cm $\sigma p = 2 \times 10^{-7}$ s/cm $Eg^{opt} = 1.75$ eV Moreover, the result of measurement of thermal electromotive force exhibited P-type.

EXAMPLE 4

In Example 1, film formation was conducted by introducing GeH$_4$ gas from the 105 bomb in place of introducing SiH$_4$ gas (Sample 4A).

The film forming conditions in this case are as follows:

| | |
|---|---|
| GeH₄ | 20 sccm |
| F₂ | 4 sccm |
| B₂H₆ (1% H₂ dilution) | 2 sccm |
| He | 40 sccm |
| Inner pressure | 800 mTorr |
| Substrate temperature | 300° C. |
| Distance between gas blowing outlet and substrate | 3 cm |

In the region where GeH₄ gas and F₂ gas were merged into one stream, strong blue luminescence was observed. After gas blowing for 2 hours, an a-Ge:H:F:B film with a thickness of about 1.7 μm was deposited on the quartz glass substrate. This film was confirmed to be amorphous by electron beam diffraction.

After an aluminum comb-shaped electrode (gap length 200 μm) was vapor deposited in vacuo on the A-Ge:H:F:B film, the sample was placed in a vacuum cryostat, and dark electroconductivity ($\sigma d$), electroconductivity ($\sigma p$) when irradiated with light of 600 nm and 0.3 mw/cm² and the optical band gap ($Eg^{opt}$) by measurement of optical absorption were measured, respectively.

The obtained values were as follows:

$\sigma d = 3 \times 10^{-6}$ s/cm $\sigma p = 5 \times 10^{-6}$ s/cm $Eg^{opt} = 1.1$ eV Moreover, the result of measurement of thermal electromotive force exhibited P-type.

EXAMPLE 5

In Example 1, film formation was conducted by introducing GeH₄ gas from the 105 bomb simultaneously with introduction of SiH₄ gas (Sample 5A).

The film forming conditions in this case are as follows:

| | |
|---|---|
| SiH₄ | 20 sccm |
| GeH₄ | 5 sccm |
| B₂H₆ (1% H₂ dilution) | 3 sccm |
| F₂ | 5 sccm |
| He | 40 sccm |
| Inner pressure | 800 mTorr |
| Substrate temperature | 300° C. |
| Distance between gas blowing outlet and substrate | 3 cm |

In the vicinity of the outlet of the gas blowing pipe, strong blue luminescence was observed. After gas blowing for 2 hours, an A-SiGe:H:F:B film was a thickness of about 1.9 μm was deposited on the quartz glass substrate. This film was confirmed to be amorphous by electron beam diffraction.

After an aluminum comb-shaped electrode (gap length 200 μm) was vapor deposited in vacuo on the A-SeGe:H:F:B film, the sample 5A was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 5 \times 10^{-8}$ s/cm $\sigma p = 2 \times 10^{-7}$ s/cm $Eg^{opt} = 1.4$ eV Moreover, the result of measurement of thermal electromotive force exhibited P-type.

EXAMPLE 6

In Example 5, film formation was conducted by introducing C₂H₄ gas from the 105 bomb in place of introduction of GeH₄ gas (Sample 6A).

The film forming conditions in this case are as follows:

| | |
|---|---|
| SiH₄ | 20 sccm |
| C₂H₄ | 5 sccm |
| B₂H₆ (1% H₂ dilution) | 3 sccm |
| F₂ | 5 sccm |
| He | 40 sccm |
| Inner pressure | 800 mTorr |
| Substrate temperature | 300° C. |
| Distance between gas blowing outlet and substrate | 3 cm |

After gas blowing for 3 hours, an A-SiC:H:F:B film with a thickness of about 1.1 μm was deposited on the quartz glass substrate. This film was confirmed to be amorphous by electron beam diffraction.

After an aluminum comb-shaped electrode (gap length 200 μm) was vapor deposited in vacuo on the A-SiC:H:F:B film, the sample 6A was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 7 \times 10^{-10}$ s/cm $\sigma p = 8 \times 10^{-9}$ s/cm $Eg^{opt} = 1.9$ eV Moreover, the result of measurement of thermal electromotive force exhibited P-type.

EXAMPLE 7

In Example 1, film formation was conducted by introducing Si₂H₆ gas from the 105 bomb simultaneously with introduction of SiH₄ gas (Sample 7A).

The film forming conditions in this case are as follows:

| | |
|---|---|
| SiH₄ | 20 sccm |
| Si₂H₆ | 5 sccm |
| B₂H₆ (1% H₂ dilution) | 3 sccm |
| F₂ | 5 sccm |
| He | 40 sccm |
| Inner pressure | 800 mTorr |
| Substrate temperature | 300° C. |
| Distance between gas blowing outlet and substrate | 3 cm |

In the vicinity of the outlet of the gas blowing pipe, strong blue luminescence was observed. After gas blowing for 1 hour, an A-Si:H:F:B film with a thickness of about 1.4 μm was deposited on the quartz glass substrate. This film was confirmed to be amorphous by electron beam diffraction.

After an aluminum comb-shaped electrode (gap length 200 μm) was vapor deposited in vacuo on the A-Si:H:F:B film, the sample 7A was placed in a vacuum cryostat, and dark electroconductivity ($\sigma$d), electroconductivity ($\sigma$p) when irradiated with light of 600 nm and 0.3 mw/cm$^2$ and the optical band gap by measurement of optical absorption (Eg$^{opt}$) were measured respectively.

The obtained values were as follows:

$\sigma d = 3 \times 10^{-9}$ s/cm $\sigma p = 5 \times 10^{-7}$ s/cm

Eg$^{opt}$ = 1.65 eV

Moreover, the result of measurement of thermal electromotive force exhibited P-type.

EXAMPLE 8

In Example 7, film formation was conducted by introducing Cl$_2$ gas from the 107 bomb simultaneously with introduction of F$_2$ gas (Sample 8A).

The film forming conditions in this case are as follows:

| | |
|---|---|
| SiH$_4$ | 20 sccm |
| Si$_2$H$_6$ | 5 sccm |
| F$_2$ | 5 sccm |
| Cl$_2$ | 2 sccm |
| B$_2$H$_6$ (1% H$_2$ dilution) | 3 sccm |
| He | 40 sccm |
| Inner pressure | 800 mTorr |
| Substrate temperature | 300° C. |
| Distance between gas blowing outlet and substrate | 3 cm |

When gases were flowed, strong blue luminescence was observed at the point where the gases were merged into one stream. After gas blowing for 1 hour, an A-Si:H:F:Cl:B film with a thickness of about 1.8 μm was deposited on the quartz glass substrate. This film was confirmed to be amorphous by electron beam diffraction.

After an aluminum comb-shaped electrode (gap length 200 μm) was vapor deposited in vacuo on the A-Si:H:F:Cl:B film, the sample 8A was placed in a vacuum cryostat, and dark electroconductivity ($\sigma$d), electroconductivity ($\sigma$p) when irradiated with light of 600 nm and 0.3 mw/cm$^2$ and the optical band gap by measurement of optical absorption (Eg$^{opt}$) were measured, respectively.

The obtained values were as follows:

$\sigma d = 7 \times 10^{-9}$ s/cm $\sigma p = 3 \times 10^{-7}$ s/cm

Eg$^{opt}$ = 1.70 eV

Moreover, the result of measurement of thermal electromotive force exhibited P-type.

EXAMPLE 9

In example 1, film formation was conducted by setting the substrate temperature at 600° C. (Sample 9A).

The film forming conditions in this case are as follows:

| | |
|---|---|
| SiH$_4$ | 20 sccm |
| F$_2$ | 5 sccm |
| B$_2$H$_6$ (1% H$_2$ dilution) | 2 sccm |
| He | 40 sccm |
| Inner pressure | 800 mTorr |
| Distance between gas blowing outlet and substrate | 3 cm |

Similarly as in Example 1, strong blue luminescence was observed at the point where the SiH$_4$ gas and F$_2$ gas were merged into one stream. After gas blowing for 3 hours, a poly-Si:H:F:B film with a thickness of about 1.0 μm was deposited on the quartz glass substrate. When the deposited film was measured by electron beam diffraction, diffraction peak of Si was observed to indicate that it was converted into a polycrystalline.

After an aluminum comb-shaped electrode (gap length 200 μm) was vapor deposited in vacuo on the poly-Si:H:F:B film, the sample 9A was placed in a vacuum cryostat, and dark electroconductivity ($\sigma$d), and the optical band gap by measurement of optical absorption (Eg$^{opt}$) were measured, respectively.

The obtained values were as follows:

$\sigma d = 8 \times 10^{-3}$ s/cm

Eg$^{opt}$ = 1.4 eV

EXAMPLE 10

In Example 1, film formation was conducted by introducing SnH$_4$ gas from the 101 bomb simultaneously with introduction of SiH$_4$ gas (Sample 10A).

The film forming conditions in this case are as follows:

| | |
|---|---|
| SiH$_4$ | 20 sccm |
| SnH$_4$ | 5 sccm |
| F$_2$ | 3 sccm |
| B$_2$H$_6$ (1% H$_2$ dilution) | 3 sccm |
| He | 40 sccm |
| Inner pressure | 800 mTorr |
| Substrate temperature | 300° C. |
| Distance between gas blowing outlet and substrate | 3 cm |

In the vicinity of the outlet of the gas blowing pipe, strong blue luminescence was observed. After gas blowing for 2 hours, an A-SiSn:H:F:B film with a thickness of about 1.8 μm was deposited on the quartz glass substrate. This film was confirmed to be amorphous by electron beam diffraction.

After an aluminum comb-shaped electrode (gap length 200 μm) was vapor deposited in vacuo on the A-SiSn:H:F:B Film, the sample 10A was placed in a vacuum cryostat, and dark electroconductivity ($\sigma$d), electroconductivity ($\sigma$p) when irradiated with light of 600 nm and 0.3 mw/cm$^2$ and the optical band gap by measurement of optical absorption (Eg$^{opt}$) were measured, respectively.

The obtained values were as follows:

$\sigma d = 4 \times 10^{-7}$ s/cm $\sigma p = 5 \times 10^{-7}$ s/cm

Eg$^{opt}$ = 1.2 eV

Moreover, from the result of measurement of thermal electromotive force, the deposited film was found to exhibit P-type conduction.

EXAMPLE 11

In Example 1, film formation was conducted by introducing $Cl_2$ gas from the 107 bomb in place of introduction of $F_2$ gas (Sample 11A).

The film forming conditions in this case are as follows:

| | |
|---|---|
| $SiH_4$ | 20 sccm |
| $Cl_2$ | 2 sccm |
| $B_2H_6$ (1% $H_2$ dilution) | 2 sccm |
| He | 40 sccm |
| Inner pressure | 800 mTorr |
| Substrate temperature | 300° C. |
| Distance between gas blowing outlet and substrate | 3 cm |

During this operation, at the point where $SiH_4$ gas and $Cl_2$ gas were merged into one stream, strong luminescence was observed. After gas blowing for 3 hours, an A-Si:H:Cl:B film with a thickness of about 1.4 μm was deposited on the quartz glass substrate. This film was confirmed to be amorphous by electron beam diffraction.

After an aluminum comb-shaped electrode (gap length 200 μm) was vapor deposited in vacuo on the A-Si:H:Cl:B film, the sample 11A was placed in a vacuum cryostat, and dark electroconductivity ($\sigma d$), electroconductivity ($\sigma p$) when irradiated with light of 600 nm and 0.3 mw/cm$^2$ and the optical band gap by measurement of optical absorption ($Eg^{opt}$) were measured, respectively.

The obtained values were as follows:

$\sigma d = 1 \times 10^{-9}$ s/cm $\sigma p = 5 \times 10^{-8}$ s/cm $Eg^{opt} = 1.70$ eV Moreover, from the result of measurement of thermal electromotive force, the deposited film was found to exhibit P-type conduction.

EXAMPLE 12

In Example 1, film formation was conducted by introducing $PH_3$ gas (1% $H_2$ gas dilution) from the 104 bomb in place of introduction of $B_2H_6$ gas (Sample 12A).

The film forming conditions in this case are as follows:

| | |
|---|---|
| $SiH_4$ | 20 sccm |
| $F_2$ | 5 sccm |
| $PH_3$ (1% $H_2$ dilution) | 2 sccm |
| He | 40 sccm |
| Inner pressure | 800 mTorr |
| Substrate temperature | 300° C. |
| Distance between gas blowing outlet and substrate | 3 cm |

During this operation, at the point where $SiH_4$ gas and $F_2$ gas were merged into one stream, strong blue luminescence was observed. After gas blowing for 1 hour, an A-Si:H:F:P film with a thickness of about 1.2 μm was deposited on the quartz glass substrate. This film was confirmed to be amorphous by electron beam diffraction.

After an aluminum comb-shaped electron (gap length 200 μm) was vapor deposited in vacuo on the A-Si:H:F:P film, the sample 12A was placed in a vacuum cryostat, and dark electroconductivity ($\sigma d$), electroconductivity ($\sigma p$) when irradiated with light of 600 nm and 0.3 mw/cm$^2$ and the optical band gap by measurement of optical absorption ($Eg^{opt}$) were measured, respectively.

The obtained values were as follows:

$\sigma d = 8 \times 10^{-7}$ s/cm $\sigma p = 3 \times 10^{-6}$ s/cm $Eg^{opt} = 1.70$ eV Moreover, from the result of measurement of thermal electromotive force, the deposited film was found to exhibit n-type conduction.

EXAMPLE 13

In Example 12, film formation was conducted by introducing $GeH_4$ gas from the 105 bomb simultaneously with introduction of $SiH_4$ gas (Sample 13A).

The film forming conditions are as follows:

| | |
|---|---|
| $SiH_4$ | 20 sccm |
| $GeH_4$ | 5 sccm |
| $F_2$ | 5 sccm |
| $PH_3$ (1% $H_2$ gas dilution) | 3 sccm |
| He | 40 sccm |
| Inner pressure | 800 mTorr |
| Substrate temperature | 300° C. |
| Distance between gas blowing outlet and substrate | 3 cm |

During this operation, in the vicinity of the outlet of the gas blowing pipe, strong blue luminescence was observed. After gas blowing for 2 hours, an A-SiGe:H:F:B film with a thickness of about 1.8 μm was deposited on the quartz glass substrate. This film was confirmed to be amorphous by electron beam diffraction.

After an aluminum comb-shaped electrode (gap length 200 μm) was vapor deposited in vacuo on the A-SiGe:H:F:B film, the sample 13A was placed in a vacuum cryostat, and dark electroconductivity ($\sigma d$), electronconductivity ($\sigma p$) when irradiated with light of 600 nm and 0.3 mw/cm$^2$ and the optical band gap by measurement of optical absorption ($Eg^{opt}$) were measured, respectively.

The obtained values were as follows:

$\sigma d = 4 \times 10^{-7}$ s/cm $\sigma p = 8 \times 10^{-7}$ s/cm $Eg^{opt} = 1.4$ eV Moreover, from the result of measurement of thermal electromotive force, the deposited film was found to exhibit n-type conduction.

EXAMPLE 14

By use of the film forming device shown in FIG. 1, a deposited film was prepared according to the process of the present invention as described below.

The SiH$_4$ gas filled in the bomb 101 was introduced at a flow rate of 20 sccm through the gas introducing pipe 109, the F$_2$ gas filled in the bomb 106 at a flow rate of 2 sccm and the He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119. A quartz glass (15 cm×15 cm) was used for the substrate, and the distance between the gas introducing inlet 111 and the substrate was set at 3 cm. Blueish white luminescence was strongly observed in the mixing region of SiH$_4$ gas and F$_2$ gas. The substrate temperature (Ts) was set at from room temperature to 400° C. for respective samples as indicated in Table B-1.

When gases were permitted to flow under such conditions for 3 hours, Si:H:F films with film thicknesses as shown in Table B-1 were deposited on the substrate.

The distribution irregularity of the film thickness was within ±5%. Every sample of the Si:H:F film formed was confirmed to be amorphous by electron beam diffraction.

On the amorphous Si:H:F film of each sample, a comb-shaped electrode (gap length 200 μm) of aluminum was vapor deposited to prepare a sample for measurement of electroconductivity. Each sample was placed in a cryostat, a voltage of 100 V was applied and the current was measured by a minute amperemeter (YHP4140B) to determine the dark electroconductivity ($\sigma d$). Also, light of 600 nm and 0.3 mw/cm$^2$ was irradiated to determine the photoconductivity ($\sigma p$). Further, from absorption of light, the optical band gap (Eg$^{opt}$) was determined. These results are shown in Table B-1.

TABLE B-1

| Sample No. | 14-1 | 14-2 | 14-3 | 14-4 | 14-5 |
|---|---|---|---|---|---|
| Substrate temperature (°C.) | 28 | 120 | 200 | 300 | 400 |
| Film thickness (μm) | 2.5 | 2.0 | 1.8 | 1.5 | 1.5 |
| $\sigma d$ (S/cm) | $1.5 \times 10^{-11}$ | $2 \times 10^{-11}$ | $3 \times 10^{-11}$ | $5 \times 10^{-11}$ | $6 \times 10^{-9}$ |
| $\sigma p$ (S/cm) | $8 \times 10^{-8}$ | $8 \times 10^{-7}$ | $2 \times 10^{-6}$ | $5 \times 10^{-6}$ | $3 \times 10^{-6}$ |
| Eg$^{opt}$ (eV) | 2.0 | 1.75 | 1.67 | 1.60 | 1.55 |

Next, when the substrate temperature was fixed at 300° C., and the flow rate of SiH$_4$ was varied, the respective samples prepared were found to give the results of film thickness, $\sigma d$, $\sigma p$ and Eg$^{opt}$ as shown in Table B-2.

The gas was flowed for 3 hours for each sample, and the F$_2$ gas flow rate was made 2 sccm, and the He gas flow rate 40 sccm and the inner pressure 800 mTorr for each sample.

TABLE B-2

| Sample No. | 14-6 | 14-7 | 14-8 | 14-9 | 14-10 |
|---|---|---|---|---|---|
| SiH$_4$ flow rate (sccm) | 5 | 10 | 20 | 40 | 80 |
| Film thickness (μm) | 0.8 | 1.2 | 1.5 | 2.0 | 2.5 |
| $\sigma d$ (S/cm) | $8 \times 10^{-11}$ | $3 \times 10^{-10}$ | $5 \times 10^{-10}$ | $7 \times 10^{-11}$ | $2 \times 10^{-10}$ |
| $\sigma p$ (S/cm) | $3 \times 10^{-6}$ | $4 \times 10^{-6}$ | $5 \times 10^{-6}$ | $3 \times 10^{-6}$ | $2 \times 10^{-6}$ |
| Eg$^{opt}$ (eV) | 1.65 | 1.65 | 1.60 | 1.60 | 1.65 |

Next, the substrate temperature was set at 300° C., SiH$_4$ gas flow rate at 20 sccm, F$_2$ gas flow rate at 2 sccm and the inner pressure at 800 mTorr, and the He gas flow rate was varied variously. The respective samples obtained after flowing the respective gases for 3 hours were found to have the film thickness and values of $\sigma d$, $\sigma p$ and Eg$^{opt}$ as shown in Table B-3.

TABLE B-3

| Sample No. | 14-11 | 14-12 | 14-13 | 14-14 | 14-15 | 14-16 |
|---|---|---|---|---|---|---|
| He Flow rate (sccm) | 0 | 5 | 10 | 20 | 40 | 80 |
| Film thickness (μm) | 0.4 | 0.8 | 1.2 | 1.5 | 1.5 | 1.5 |
| $\sigma d$ (S/cm) | $8 \times 10^{-11}$ | $1 \times 10^{-10}$ | $4 \times 10^{-10}$ | $1 \times 10^{-10}$ | $5 \times 10^{-10}$ | $3 \times 10^{-10}$ |
| $\sigma p$ (S/cm) | $3 \times 10^{-6}$ | $4 \times 10^{-6}$ | $5 \times 10^{-6}$ | $3 \times 10^{-6}$ | $5 \times 10^{-6}$ | $8 \times 10^{-6}$ |
| Eg$^{opt}$ (eV) | 1.65 | 1.65 | 1.60 | 1.65 | 1.60 | 1.65 |

Next, the substrate temperature was set at 300° C., SiH$_4$ gas flow rate at 20 sccm, F$_2$ gas flow rate at 2 sccm and He gas flow rate at 40 sccm, and the inner pressure was varied variously. The respective samples obtained were found to have the film thickness and values of $\sigma d$, $\sigma p$ and Eg$^{opt}$ as shown in Table B-4.

TABLE B-4

| Sample No. | 14-17 | 14-18 | 14-19 | 14-20 | 14-21 |
|---|---|---|---|---|---|
| Inner pressure | 10 mTorr | 100 mTorr | 1 Torr | 10 Torr | 100 Torr |
| Film thickness (μm) | 0.4 | 1.2 | 1.8 | 1.0 | 0.5 |
| $\sigma d$ (S/cm) | $3 \times 10^{-11}$ | $4 \times 10^{-11}$ | $4 \times 10^{-10}$ | $2 \times 10^{-10}$ | $5 \times 10^{-10}$ |
| $\sigma p$ (S/cm) | $8 \times 10^{-7}$ | $2 \times 10^{-6}$ | $4 \times 10^{-6}$ | $3 \times 10^{-7}$ | $1 \times 10^{-7}$ |

TABLE B-4-continued

| Sample No. | 14-17 | 14-18 | 14-19 | 14-20 | 14-21 |
|---|---|---|---|---|---|
| $Eg^{opt}$ (eV) | 1.65 | 1.60 | 1.65 | 1.60 | 1.65 |

The distribution irregularity of the film thickness of the respective samples shown in Table B-1 to Table B-4 was found to be dependent on the distance between the gas introducing pipe 111 and the substrate, the gas flow rates flowed through the gas introducing pipes 109 and 111 and the inner pressure. In each film formation, the distribution irregularlity of film thickness could be controlled within ±5% in the substrate of 15 cm × 15 cm by controlling the distance between the gas introducing pipe and the substrate. This position was found to correspond to the position of the maximum emission intensity in most cases. Also, the Si:H:F film formed in every sample was confirmed to be amorphous from the result of electron beam diffraction.

EXAMPLE 15

Film formation was conducted by introducing $Cl_2$ gas from the 107 bomb simultaneously with introduction of $F_2$ gas in Example 14 (Sample 2B).

The film forming conditions in this case are as follows:

| | |
|---|---|
| $SiH_4$ | 20 sccm |
| $F_2$ | 2 sccm |
| $Cl_2$ | 2 sccm |
| He | 40 sccm |
| Inner pressure | 800 mTorr |
| Substrate temperature | 300° C. |
| Distance between gas blowing outlet and substrate | 3 cm |

Similarly as in Example 14, strong blue luminescence was observed in the region where $SiH_4$ gas and ($F_2+Cl_2$) gas were merged into one stream. After gas blowing for 3 hours, an A-Si:H:F:Cl film with a thickness of about 2.5 μm was deposited on the quartz glass substrate.

This film was found to be amorphous as conformed by electron beam diffraction.

After an aluminum comb-shaped electrode (gap length 200 μm) was vapor deposited in vacuo on the A-Si:H:F:Cl film, the sample was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 4 \times 10^{-11}$ s/cm $\sigma p = 8 \times 10^{-7}$ s/cm $Eg^{opt} = 1.70$ eV

EXAMPLE 16

In Example 14, film formation was conducted by introducing $Si_2H_6$ gas from the 103 bomb in place of introducing $SiH_4$ gas (Sample 3B).

The film forming conditions in this case are as follows:

| | |
|---|---|
| $Si_2H_6$ | 20 sccm |
| $F_2$ | 5 sccm |
| He | 40 sccm |
| Inner pressure | 800 mTorr |
| Substrate temperature | 300° C. |
| Distance between gas blowing outlet and substrate | 3 cm |

In the region where $Si_2H_6$ gas and $F_2$ gas were merged into one stream, strong blue luminescence was observed. After gas blowing for 1 hour, an A-Si:H:F film with a thickness of about 1.8 μm was deposited on the quartz glass substrate.

This film was confirmed to be amorphous by electron beam diffraction.

After an aluminum comb-shaped electrode (gap length 200 μm) was vapor deposited in vacuo on the A-Si:H:F film, the sample was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 8 \times 10^{-11}$ s/cm $\sigma p = 2 \times 10^{-6}$ s/cm $Eg^{opt} = 1.70$ eV

EXAMPLE 17

In Example 14, film formation was conducted by introducing $GeH_4$ gas from the 104 bomb in place of introducing $SiH_4$ gas (Sample 4B).

The film forming conditions in this case are as follows:

| | |
|---|---|
| $GeH_4$ | 20 sccm |
| $F_2$ | 4 sccm |
| He | 40 sccm |
| Inner pressure | 800 mTorr |
| Substrate temperature | 300° C. |
| Distance between gas blowing outlet and substrate | 3 cm |

In the region where $GeH_4$ gas and $F_2$ gas were merged into one stream, strong blue luminescence was obserbed. After gas blowing for 2 hours, an A-Ge:H:F film with a thickness of about 1.5 μm was deposited on the quartz glass substrate. This film was confirmed to be amorphous by electron beam diffraction.

After an aluminum comb-shaped electrode (gap length 200 μm) was vapor deposited in vacuo on the A-Ge:H:F film, the sample was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 8 \times 10^{-7}$ s/cm $\sigma p = 3 \times 10^{-6}$ s/cm $Eg^{opt}=1.0$ eV

EXAMPLE 18

In Example 14, film formation was conducted by introducing GeH$_4$ gas from the 104 bomb simultaneously with introduction of SiH$_4$ gas (Sample 5B).

The film forming conditions in this case are as follows:

| | |
|---|---|
| SiH$_4$ | 20 sccm |
| GeH$_4$ | 5 sccm |
| F$_2$ | 5 sccm |
| He | 40 sccm |
| Inner pressure | 800 mTorr |
| Substrate temperature | 300° C. |
| Distance between gas blowing outlet and substrate | 3 cm |

In the vicinity of the outlet of the gas blowing pipe, strong blue luminescence was observed. After gas blowing for 2 hours, an A-SiGe:H:F film with a thickness of about 2.0 μm was deposited on the quartz glass substrate. This film was confirmed to be amorphous by electron beam diffraction.

After an aluminum comb-shaped electrode (gap length 200 μm) was vapor deposited in vacuo on the A-SiGe:H:F film, the sample 5B was placed in a vacuum cryostat, and dark electronconductivity ($\sigma d$), electroconductivity ($\sigma p$) when irradiated with light of 600 nm and 0.3 mw/cm$^2$ and the optical band gap by measurement of optical absorption ($Eg^{opt}$) were measured, respectively.

The obtained values were as follows:

$\sigma d = 3 \times 10^{-9}$ s/cm $\sigma p = 1 \times 10^{-7}$ s/cm $Eg^{opt} = 1.4$ eV

EXAMPLE 19

In Example 18, film formation was conducted by introducing C$_2$H$_4$ gas from the 105 bomb in place of introduction of GeH$_4$ gas (Sample 6B).

The film forming conditions in this case are as follows:

| | |
|---|---|
| SiH$_4$ | 20 sccm |
| C$_2$H$_4$ | 5 sccm |
| F$_2$ | 5 sccm |
| He | 40 sccm |
| Inner pressure | 800 mTorr |
| Substrate temperature | 300° C. |
| Distance between gas blowing outlet and substrate | 3 cm |

After gas blowing for 3 hours, an A-SiC:H:F film with a thickness of about 1.0 μm was deposited on the quartz glass substrate. The film was confirmed to be amorphous by electron beam diffraction.

After an aluminum comb-shaped electrode (gap length 200 μm) was vapor deposited in vacuo on the A-SiC:H:F film, the sample 6B was placed in a vacuum cryostat, and dark electroconductivity ($\sigma d$), electroconductivity ($\sigma p$) when irradiated with light of 600 nm and 0.3 mw/cm$^2$ and the optical band gap by measurement of optical absorption ($Eg^{opt}$) were measured, respectively.

The obtained values were as follows:

$\sigma d = 8 \times 10^{-13}$ s/cm $\sigma p = 1 \times 10^{-8}$ s/cm $Eg^{opt} = 1.9$ eV

EXAMPLE 20

In Example 14, film formation was conducted by introducing Si$_2$H$_6$ gas from the 103 bomb simultaneously with introduction of SiH$_4$ gas (Sample 7B).

The film forming conditions in this case are as follows:

| | |
|---|---|
| SiH$_4$ | 20 sccm |
| Si$_2$H$_6$ | 5 sccm |
| F$_2$ | 5 sccm |
| He | 40 sccm |
| Inner pressure | 800 mTorr |
| Substrate temperature | 300° C. |
| Distance between gas blowing outlet and substrate | 3 cm |

In the vicinity of the outlet of the gas blowing pipe, strong blue luminescence was observed. After gas blowing for 1 hour, an A-Si:H:F film with a thickness of about 1.2 μm was deposited on the quartz glass substrate. This film was confirmed to be amorphous by electron beam diffraction.

After an aluminum comb-shaped electrode (gap length 200 μm) was vapor deposited in vacuo on the A-Si:H:F film, the sample 7B was placed in a vacuum cryostat, and dark electroconductivity ($\sigma d$), electroconductivity ($\sigma p$) when irradiated with light of 600 nm and 0.3 mw/cm$^2$ and the optical band gap by measurement of optical absorption ($Eg^{opt}$) were measured, respectively.

The obtained values were as follows:

$\sigma d = 7 \times 10^{-11}$ s/cm $\sigma p = 9 \times 10^{-7}$ s/cm $Eg^{opt} = 1.65$ eV

EXAMPLE 21

In Example 20, film formation was conducted by introducing Cl$_2$ gas from the 107 bomb simultaneously with introduction of F$_2$ gas (Sample 8B).

The film forming conditions in this case are as follows:

| | |
|---|---|
| SiH$_4$ | 20 sccm |
| Si$_2$H$_6$ | 5 sccm |
| F$_2$ | 3 sccm |
| Cl$_2$ | 2 sccm |
| He | 40 sccm |
| Inner pressure | 800 mTorr |
| Substrate temperature | 300° C. |
| Distance between gas blowing outlet and substrate | 3 cm |

When gases were flowed, strong blue luminescence was observed at the point where the gases were merged into one stream. After gas blowing for 1 hour, an A-Si:H:F:Cl film with a thickness of about 1.8 μm was deposited on the quartz glass substrate. This film was confirmed to be amorphous by electron beam diffraction.

After an aluminum comb-shaped electrode (gap length 200 μm) was vapor deposited in vacuo on the A-Si:H:F:Cl film, the sample 8B was placed in a vacuum cryostat, and dark electroconductivity ($\sigma d$), electroconductivity ($\sigma p$) when irradiated with light of 600 nm and 0.3 mw/cm$^2$ and the optical band gap by measurement of optical absorption (Eg$^{opt}$) were measured, respectively.

The obtained values were as follows:

$\sigma d = 8 \times 10^{-11}$ s/cm $\sigma p = 9 \times 10^{-7}$ s/cm

Eg$^{opt} = 1.70$ eV

EXAMPLE 22

In Example 14, film formation was conducted by introducing SnH$_4$ gas from the 102 bomb in place of introduction of SiH$_4$ gas (Sample 9B).

The film forming conditions in this case are as follows:

| | |
|---|---|
| SnH$_4$ | 10 sccm |
| F$_2$ | 20 sccm |
| He | 40 sccm |
| Inner pressure | 800 mTorr |
| Substrate temperature | 300° C. |
| Distance between gas blowing outlet and substrate | 4 cm |

Strong blue luminescence was observed at the point where the SnH$_4$ gas and F$_2$ gas were merged into one stream. After gas blowing for 3 hours, an A-Sn:H:F film with a thickness of about 1.0 μm was deposited on the quartz glass substrate. This film was confirmed to be amorphous by electron beam diffraction.

After an aluminum comb-shaped electrode (gap length 200 μm) was vapor deposited in vacuo on the A-Sn:H:F film, the sample was placed in a vacuum cryostat similarly as in Example 1, and dark electroconductivity ($\sigma d$), and the optical band gap by measurement of optical absorption (Eg$^{opt}$) were measured, respectively.

The obtained values were as follows:

$\sigma d = 3 \times 10^{-6}$ s/cm

Eg$^{opt} = 0.80$ eV

EXAMPLE 23

In Example 14, film formation was conducted by setting the substrate temperature at 600° C. (Sample 10B).

The film forming conditions in this case are as follows:

| | |
|---|---|
| SiH$_4$ | 20 sccm |
| F$_2$ | 2 sccm |
| He | 40 sccm |
| Inner pressure | 800 mTorr |
| Distance between gas blowing outlet and substrate | 3 cm |

Similarly as in Example 14, strong blue luminescence was observed at the point where the SiH$_4$ gas and F$_2$ gas were merged into one stream. After gas blowing for 3 hours, an A-Si:H:F film with a thickness of about 1.0 μm was deposited on the quartz glass substrate. When the deposited film was measured by electron beam diffraction, diffraction peak of Si was observed to indicate that is was polycrystallized.

After an aluminum comb-shaped electrode (gap length 200 μm) was vapor deposited in vacuo on the Si:H:F film, the sample 10B was placed in a vacuum cryostat, and dark electroconductivity ($\sigma d$), and the optical band gap by measurement of optical absorption (Eg$^{opt}$) were measured, respectively.

The obtained values were as follows:

$\sigma d = 3 \times 10^{-3}$ s/cm

Eg$^{opt} = 1.4$ eV

EXAMPLE 24

In Example 14, film formation was conducted by introducing SnH$_4$ gas from the 104 bomb simultaneously with introduction of SiH$_4$ gas (Sample 11B).

The film forming conditions in this case are as follows:

| | |
|---|---|
| SiH$_4$ | 20 sccm |
| SnH$_4$ | 5 sccm |
| F$_2$ | 3 sccm |
| He | 40 sccm |
| Inner pressure | 800 mTorr |
| Substrate temperature | 300° C. |
| Distance between gas blowing outlet and substrate | 3 cm |

In the vicinity of the outlet of the gas blowing pipe, strong blue luminescence was observed. After gas blowing for 2 hours, an A-SiSn:H:F film with a thickness of about 2.2 μm was deposited on the quarts glass substrate. This film was confirmed to be amorphous by electron beam diffraction.

After an aluminum comb-shaped electrode (gap length 200 μm) was vapor deposited in vacuo on the A-SiSn:H:F film, the sample 11B was placed in a vacuum cryostat, and dark electroconductivity ($\sigma d$), electroconductivity ($\sigma p$) when irradiated with light of 600 nm and 0.3 mw/cm$^2$ and the optical band gap by measurement of optical absorption (Eg$^{opt}$) were measured, respectively.

The obtained values were as follows:

$\sigma d = 3 \times 10^{-8}$ s/cm $\sigma p = 9 \times 10^{-8}$ s/cm

Eg$^{opt} = 1.2$ eV

EXAMPLE 25

In Example 14, in place of SiH$_4$ gas, a bomb filled with Al$_2$(CH$_3$)$_6$ gas was conducted to the connecting valve of the 102 gas bomb and Al$_2$(CH$_3$)$_6$ gas was flowed by bubbling with He gas to perform film formation (Sample 12B). The bubbling temperature was made 60° C. He gas bombs were provided at the two positions of the bombs 101 and 106.

The film forming conditions are as follows:

| | |
|---|---|
| He flow rate when bubbling Al₂(CH₃)₆ | 20 sccm |
| F₂ | 5 sccm |
| He flow rate when flowed with F₂ gas | 40 sccm |
| Inner pressure | 800 mTorr |
| Substrate temperature | room temperature |
| Substrate | quartz substrate |
| Distance between gas blowing outlet and substrate | 3 cm |

During this operation, luminescence was observed from the vicinity of the gas blowing outlet to the substrate.

After gas blowing for 30 minutes, a film of Al of 3000 Å was found to be deposited on the quartz substrate. Electroconductivity was not substantially changed from that of Al prepared by vacuum deposition. Also, adhesion to the quartz substrate was markedly better as compared with the Al film formed by vapor deposition.

EXAMPLE 26

In Example 14, in place of SiH₄ gas W(CO)₆ bomb was used as the 102 gas bomb. And, W(CO)₆ was flowed by bubbling with He gas to perform film formation (Sample 13B). The bubbling temperature was made 60° C. He gas bombs are provided at the two positions of the bombs of 101 and 106.

| | |
|---|---|
| He flow rate when bubbling W(CO)₆ | 20 sccm |
| F₂ | 5 sccm |
| He flow rate when flowed with F₂ gas | 40 sccm |
| Inner pressure | 800 mTorr |
| Substrate temperature | room temperature |
| Substrate | quartz substrate |
| Distance between gas blowing outlet and substrate | 3 cm |

During this operation, luminescence was observed from the vicinity of the gas blowing outlet to the substrate.

After gas blowing for 30 minutes, a film of W of 5000 Å was found to be deposited on the quartz substrate. Electroconductivity was not substantially changed from that of W film prepared by electron beam vacuum deposition. Also, adhesion to the quartz substrate was markedly better as compared with the W film formed by electron beam vapor deposition.

EXAMPLE 27

In Example 14, film formation was conducted by flowing H₂Se gas in place of flowing SiH₄ gas (Sample 14B).

The film forming conditions are as follows:

| | |
|---|---|
| H₂Se | 20 sccm |
| F₂ | 10 sccm |
| He | 40 sccm |
| Inner pressure | 800 mmTorr |
| Substrate temperature | 60° C. |
| Substrate | quartz substrate |
| Distance between gas blowing outlet and substrate | 3 cm |

When gases were flowed, luminescence was observed from the vicinity of the gas blowing outlet to the substrate.

After gas blowing for 30 minutes, an Se film of about 2 μm was found to be deposited on the quartz substrate.

The Se film obtained was confirmed to be amorphous as the result of electron beam diffraction. An aluminum comb-shaped electrode was vapor deposited in vacuo on Se film, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured according to the methods as described in Example 19.

The obtained values were as follows:

$\sigma d = 3 \times 10^{-13}$ s/cm $\sigma p = 2 \times 10^{-8}$ s/cm $Eg^{opt} = 2.1$ eV

EXAMPLE 28

In Example 14, film formation was conducted by introducing Cl₂ gas from the 107 bomb in place of introduction of F₂ gas (Sample 15B).

The film forming conditions in this case are as follows:

| | |
|---|---|
| SiH₄ | 20 sccm |
| Cl₂ | 2 sccm |
| He | 40 sccm |
| Inner pressure | 800 mTorr |
| Substrate temperature | 300° C. |
| Distance between gas blowing outlet and substrate | 3 cm |

During this operation, at the point where SiH₄ gas and Cl₂ gas were merged into one stream, strong luminescence was observed. After gas blowing for 3 hours, an A-Si:H:Cl film with a thickness of about 1.5 μm was deposited on the quartz glass substrate. This film was confirmed to be amorphous by electron beam diffraction.

After an aluminum comb-shaped electrode (gap length 200 μm) was vapor deposited in vacuo on the A-Si:H:Cl film, the sample 15B was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 2 \times 10^{-11}$ s/cm $\sigma p = 2 \times 10^{-8}$ s/cm $Eg^{opt} = 1.70$ eV

EXAMPLE 29

By use of the film forming device shown in FIG. 1, a deposited film was prepared according to the process of the present invention as described below.

The SiH₄ gas filled in the bomb 101 was introduced at a flow rate of 100 sccm through the gas introducing pipe 109, the F₂ gas diluted to 10% with He gas filled in the bomb 106 at a flow rate of 1000 sccm through the gas introducing pipe 111 into the vacuum chamber 120. During this operation, the pressure in the vacuum chamber 120 was made 400 mTorr by controlling the opening of the vacuum valve 119. In the mixing region of SiH₄ gas and F₂ gas, blue luminescence was strongly observed.

Figure 2:
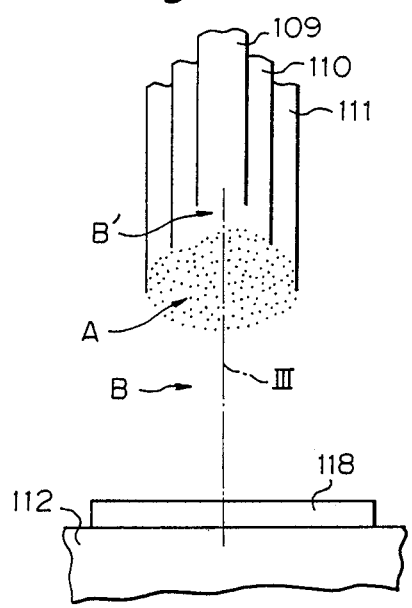
FIG. 2 is an illustration of the state of luminescence in Examples of the method of the present invention.

FIG. 2 is an illustration showing the state of the luminescence.

Figure 3:
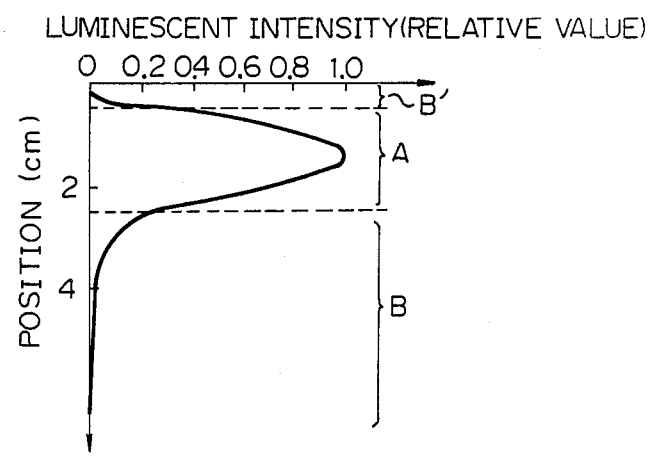
FIG. 3 is a graph showing the intensity distribution of the luminescence.

In FIG. 2, A is the luminescent region and B, B' are non-luminescent regions. The luminescence intensities on the respective positions on the line III in FIG. 2 were collectively focused by use of a fiber lens and detected by a photodiode array to obtain the luminescence intensity distribution as shown in FIG. 3. Also in FIG. 3, A shows the luminescent region and B, B' non-luminescent regions. In FIG. 3, the position was measured from the position in which the mixing of the starting gas and the halogen type oxidizing agent gas is initiated, namely from the lower end of the gas introducing pipe 109, and the quartz glass substrate (10 cm × 10 cm) was placed at a distance of 10 cm from the lower end of the gas introducing pipe 109.

When formation of a deposited film was performed under the same conditions as in measurement of the luminescence intensity as described above except for setting the temperature of the quartz glass substrate (10 cm × 10 cm) (Ts) at 200° C. and changing the distance of the substrate from the position at which the mixing of the gases is initiated, a Si:H:F film with a thickness as shown in Table C-1 was deposited on the substrate. The distribution irregularity of the film thickness of the deposited film on the substrate arranged in the non-luminescent region B was within ±0.5% in all of the samples. Every sample of the Si:H:F film formed was confirmed to be amorphous by electron beam diffraction.

On the amorphous Si:H:F film of each sample, a comb-shaped electrode (gap length 200 μm) of aluminum was vapor deposited to prepare a sample for measurement of electroconductivity. Each sample was placed in a cryostat, a voltage of 100 V was applied and the current was measured by a micro-amperemeter (YHP4140B) to determine the dark electroconductivity ($\sigma d$). Also, light of 600 nm and 0.3 mw/cm² was irradiated to determine the photoconductivity ($\sigma p$). These results are shown in Table C-1. Also, the measurement results of the ratio of the luminescence intensity at the film forming position (I) to the maximum luminescence intensity (Imax) during preparation of sample are shown in the same Table.

TABLE C-1

| Sample No. | 29-1 (Comparative) | 29-2 (Comparative) | 29-3 | 29-4 | 29-5 | 29-6 |
|---|---|---|---|---|---|---|
| Substrate position | 1 cm | 2 cm | 2.5 cm | 3 cm | 5 cm | 10 cm |
| Film thickness (μm) | 0.1 | 0.3 | 1.6 | 1.8 | 1.7 | 1.6 |
| $\sigma_d$ (s/cm) | $2 \times 10^{-11}$ | $3 \times 10^{-10}$ | $3 \times 10^{-11}$ | $3 \times 10^{-11}$ | $4 \times 10^{-11}$ | $3 \times 10^{-11}$ |
| $\sigma_p$ (s/cm) | $5 \times 10^{-8}$ | $6 \times 10^{-8}$ | $3 \times 10^{-6}$ | $2 \times 10^{-6}$ | $2 \times 10^{-6}$ | $3 \times 10^{-6}$ |
| I/Imax | 1 | 4/5 | 1/5 | 1/10 | 1/20 | 1/50 |

Next, the position of the substrate was fixed at 5 cm from the mixing initiating position (lower end position of the pipe 109), and deposited films were formed by varying variously the flow rate of SiH₄ gas. F₂ gas diluted to 5% with He gas was introduced at a flow rate of 1000 sccm into the vacuum chamber 120. The pressure within the chamber 120 was made 400 m Torr, and the substrate temperature 220° C.

The values of film thickness, $\sigma d$, and $\sigma p$ of the respective samples are shown in Table C-2. I/Imax during preparation of respective samples was all 1/5 or less. The film forming speed was 15 to 40 Å/sec.

TABLE C-2

| Sample No. | 29-7 | 29-8 | 29-9 | 29-10 | 29-11 |
|---|---|---|---|---|---|
| SiH₄ flow rate (sccm) | 5 | 10 | 20 | 40 | 80 |
| Film thickness (μm) | 0.6 | 1.1 | 1.8 | 3.0 | 0.5 |
| $\sigma_d$ (s/cm) | $2 \times 10^{-11}$ | $4 \times 10^{-11}$ | $3 \times 10^{-11}$ | $4 \times 10^{-11}$ | $6 \times 10^{-11}$ |
| $\sigma_p$ (s/cm) | $4 \times 10^{-6}$ | $5 \times 10^{-6}$ | $2 \times 10^{-6}$ | $3 \times 10^{-6}$ | $3 \times 10^{-6}$ |

Next, the substrate temperature was set at 200° C., SiH₄ gas flow rate at 20 sccm, and the inner pressure within the vacuum chamber at 300 mTorr, and the flow rate of the F₂ gas diluted to 5% with He gas varied to carry out formation of deposited films for 30 minutes, respectively. The substrate was positioned at 5 cm from the gas mixing initiating position.

The values of $\sigma d$, $\sigma p$ of the respective samples are shown in Table C-3. I/Imax during preparation of respective samples was all 1/5 or less. The film forming speed was 15 to 40 Å/sec.

TABLE C-3

| Sample No. | 29-12 | 29-13 | 29-14 | 29-15 | 29-16 | 29-17 |
|---|---|---|---|---|---|---|
| F₂/He flow rate (sccm) | 125 | 250 | 500 | 1000 | 2000 | 4000 |
| $\sigma_d$ (s/cm) | $7 \times 10^{-11}$ | $3 \times 10^{-11}$ | $3 \times 10^{-11}$ | $5 \times 10^{-11}$ | $4 \times 10^{-11}$ | $8 \times 10^{-11}$ |
| $\sigma_p$ (s/cm) | $6 \times 10^{-6}$ | $8 \times 10^{-6}$ | $8 \times 10^{-6}$ | $8 \times 10^{-6}$ | $5 \times 10^{-6}$ | $3 \times 10^{-6}$ |

Next, the substrate temperature was set at 200° C., SiH₄ gas flow rate at 20 sccm, the flow rate of F₂ gas diluted to 5% with He gas at 1000 sccm and the inner pressure in the vacuum chamber was varied to carry out formation of deposited films for 30 minutes, respectively. The substrate was positioned at 5 cm from the gas mixing initiating position. The values of $\sigma d$, $\sigma p$ of the respective samples are shown in Table C-4. I/Imax during preparation of respective samples was all 1/5 or less. The film forming speed was 15 to 40 Å/sec.

TABLE C-4

| Sample No. | 29-18 | 29-19 | 29-20 | 29-21 | 29-22 |
|---|---|---|---|---|---|
| Inner pressure | 10 mTorr | 100 mTorr | 1 Torr | 10 Torr | 100 Torr |
| $\sigma_d$ (s/cm) | $3 \times 10^{-11}$ | $3 \times 10^{-11}$ | $5 \times 10^{-11}$ | $4 \times 10^{-11}$ | $3 \times 10^{-11}$ |
| $\sigma_p$ (s/cm) | $2 \times 10^{-6}$ | $4 \times 10^{-6}$ | $3 \times 10^{-6}$ | $8 \times 10^{-7}$ | $3 \times 10^{-7}$ |

The distribution irregularity of the film thickness of the respective samples shown in Table C-1 to Table C-4 was found to be dependent on the distance between the gas introducing pipe 111 and the substrate, the gas flow rates flowed through the gas introducing pipes 109 and 111 and the inner pressure in the vacuum chamber 120.

Also, the Si:H:F film formed in every sample was confirmed to be amorphous from the result of electron beam diffraction.

EXAMPLE 30

In Example 29, $Cl_2$ gas diluted to 5% with He gas filled in the bomb 107 was further introduced through the introducing pipe 111 into the vacuum chamber 120 to carry out formation of a deposited film (Sample 2C).

The film forming conditions in this case are as follows:

| | |
|---|---|
| $SiH_4$ | 20 sccm |
| $F_2/He$ | 500 sccm |
| $Cl_2/He$ | 500 sccm |
| Inner pressure | 350 mTorr |
| Substrate temperature | 200° C. |
| Distance between gas blowing outlet and substrate | 5 cm |

Similarly as in Example 29, strong blue luminescence having the maximum intensity at the position about 2 cm from the position where $SiH_4$ gas and $(F_2+Cl_2)$ gas were merged into one stream was observed. After introduction of the gases for 30 minutes, an A-Si:H:F:Cl film with a thickness of about 3 μm was deposited on the quartz glass substrate.

This film was found to be amorphous as confirmed by electron beam diffraction.

After an aluminum comb-shaped electrode (gap length 200 μm) was vapor deposited in vacuo on the A-Si:H:F:Cl film, the sample 2C was placed in a vacuum cryostat, and dark electroconductivity ($\sigma d$), electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$$\sigma d = 2 \times 20^{-11} \text{ s/cm}$$

$$\sigma p = 9 \times 10^{-7} \text{ s/cm}$$

$$Eg^{opt} = 1.65 \text{ eV}$$

In the sample for comparative purpose, for which a deposited film was formed at a substrate position of 1.5 cm in the luminescent region (A), the following results were obtained:

film thickness: 0.8 μm $$\sigma d = 5 \times 10^{-11} \text{ s/cm}$$

$$\sigma p = 7 \times 10^{-7} \text{ s/cm}$$

$$Eg^{opt} = 1.6 \text{ eV}.$$

EXAMPLE 31

In Example 29, film formation was conducted by introducing $Si_2H_6$ gas from the 103 bomb in place of introducing $SiH_4$ gas (Sample 3C).

The film forming conditions in this case are as follows:

| | |
|---|---|
| $Si_2H_6$ | 20 sccm |
| $F_2/He$ (5% $F_2$) | 1000 sccm |
| Inner pressure | 300 mTorr |
| Substrate temperature | 200° C. |
| Distance between gas blowing outlet and substrate | 5 cm |

Strong blue luminescence was observed having the maximum intensity at the position about 3 cm from the position where $Si_2H_6$ gas and $F_2$ gas were merged into one stream. After introduction of the gases for 10 minutes, an A-Si:H:F film with a thickness of about 1.7 μm was deposited on the quartz glass substrate.

This film was confirmed to be amorphous by electorn beam diffraction.

After an aluminum comb-shaped electrode (gap length 200 μm) was vapor deposited in vacuo on the A-Si:H:F film, the sample was placed in a vacuum cryostat, and dark electroconductivity ($\sigma d$) and electroconductivity ($\sigma p$) when irradiated with light of 600 nm and 0.3 mw/cm² were measured, respectively.

The obtained values were as follows:

$$\sigma d = 6 \times 10^{-11} \text{ s/cm}$$

$$\sigma p = 3 \times 10^{-6} \text{ s/cm}$$

In the sample for comparative purpose, for which a deposited film was formed at a substrate position of 1.5 cm in the luminescent region (A), the following results were obtained:

film thickness: 0.5 μm $$\sigma d = 3 \times 10^{-11} \text{ s/cm}$$

$$\sigma p = 9 \times 10^{-8} \text{ s/cm}$$

EXAMPLE 32

In Example 29, film formation was conducted by introducing $GeH_4$ gas from the 104 bomb in place of introducing $SiH_4$ gas (Sample 4C).

The film forming conditions in this case are as follows:

| | |
|---|---|
| $GeH_4$ | 20 sccm |
| $F_2/He$ (10% $F_2$) | 1000 sccm |
| Inner pressure | 300 mTorr |
| Substrate temperature | 200° C. |
| Distance between gas blowing | 5 cm |

Strong blue luminescence was observed having the maximum intensity at a position about 2 cm from the position where GeH₄ gas and F₂ gas were merged into one stream. After introduction of the gases for 20 minutes, an A-Ge:H:F film with a thickness of about 1.6 μm was deposited on the quartz glass substrate. This film was confirmed to be amorphous by electron beam diffraction.

After an aluminum comb-shaped electrode (gap length 200 μm) was vapor deposited in vacuo on the A-Ge:H:F film, the sample was placed in a vacuum cryostat, and dark electroconductivity ($\sigma d$) and electroconductivity ($\sigma p$) when irradiated with light of 600 nm and 0.3 mw/cm² were measured, respectively.

The obtained values were as follows:

$\sigma d = 6 \times 10^{-7}$ s/cm $\sigma p = 5 \times 10^{-6}$ s/cm

EXAMPLE 33

In Example 29, film formation was conducted by introducing GeH₄ gas from the 104 bomb simultaneously with introduction of SiH₄ gas (Sample 5C).

The film forming conditions in this case are as follows:

| | |
|---|---|
| SiH₄ | 20 sccm |
| GeH₄ | 5 sccm |
| F₂/He (5% F₂) | 1200 sccm |
| Inner pressure | 400 mTorr |
| Substrate temperature | 200° C. |
| Distance between gas blowing outlet and substrate | 5 cm |

Strong blue luminescence was observed having the maximum intensity at a position about 2 cm from the outlet of the gas blowing pipe. After introduction of the gases for 20 minutes, an A-SiGe:H:F film with a thickness of about 1.9 μm was deposited on the quartz glass substarte. This film was confirmed to be amorphous by electron beam diffraction.

After an aluminun comb-shaped electrode (gap length 200 μm) was vapor deposited in vacuo on the A-SiGe:H:F film, the sample was placed in a vacuum cryostat, and dark electroconductivity ($\sigma d$) and electroconductivity ($\sigma p$) when irradiated with light of 600 nm and 0.3 mw/cm² were measured, respectively.

The obtained values were as follows:

$\sigma d = 8 \times 10^{-9}$ s/cm $\sigma p = 6 \times 10^{-6}$ s/cm

EXAMPLE 34

In Example 33, film formation was conducted by introducing C₂H₄ gas from the 105 bomb in place of introduction of GeH₄ gas (Sample 6C).

The film forming conditions in this case are as follows:

| | |
|---|---|
| SiH₄ | 20 sccm |
| C₂H₄ | 5 sccm |
| F₂ | 1200 sccm |
| Inner pressure | 400 mTorr |
| Substrate temperature | 200° C. |
| Distance between gas blowing outlet and substrate | 5 cm |

After introduction of the gases for 30 minutes, an A-SiC:H:F film with a thickness of about 1.1 μm was deposited on the quartz glass substrate. This film was confirmed to be amorphous by electron beam diffraction.

After an aluminum comb-shaped electrode (gap length 200 μm) was vapor deposited in vacuo on the A-SiC:H:F film, the sample 6C was placed in a vacuum cryostat, and dark electroconductivity ($\sigma d$), and electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 6 \times 10^{-13}$ s/cm $\sigma p = 3 \times 10^{-8}$ s/cm $Eg^{opt} = 1.9$ eV In the sample for comparative purpose, for which a deposited film was formed at a substrate position of 1.5 cm in the luminescent region (A), the following results were obtained:

film thickness: 0.4 μm $\sigma d = 8 \times 10^{-11}$ s/cm $\sigma p = 2 \times 10^{-8}$ s/cm $Eg^{opt} = 1.85$ eV

EXAMPLE 35

In Example 29, film formation was conducted by introducing Si₂H₆ gas from the 103 bomb simultaneously with introduction of SiH₄ gas (Sample 7C).

The film forming conditions in this case are as follows:

| | |
|---|---|
| SiH₄ | 20 sccm |
| Si₂H₆ | 5 sccm |
| F₂/He (10% F₂) | 1200 sccm |
| Inner pressure | 400 mTorr |
| Substrate temperature | 200° C. |
| Distance between gas blowing outlet and substrate | 5 cm |

Strong blue luminescence was observed having the maximum intensity at a position about 2 cm from the gas blowing outlet. After introduction of the gases for 10 minutes, an A-Si:H:F film with a thickness of about 1.3 μm was deposited on the quartz glass substrate. This film was confirmed to be amorphous by electron beam diffraction.

After an aluminum comb-shaped electrode (gap length 200 μm) was vapor deposited in vacuo on the A-Si:H:F film, the sample 7C was placed in a vacuum cryostat, and dark electroconductivity ($\sigma d$), and electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 6 \times 10^{-11}$ s/cm $\sigma p = 1 \times 10^{-6}$ s/cm $Eg^{opt} = 1.65$ eV

EXAMPLE 36

In Example 35, film formation was conducted by introducing Cl₂ gas from the 107 bomb simultaneously with introduction of F₂ gas (Sample 8C).

The film forming conditions in this case are as follows:

| | |
|---|---|
| SiH₄ | 20 sccm |
| Si₂H₆ | 5 sccm |
| F₂/He (10% F₂) | 800 sccm |
| Cl₂/He (10% Cl₂) | 400 sccm |
| Inner pressure | 400 mTorr |
| Substrate temperature | 200° C. |
| Distance between gas blowing outlet and substrate | 5 cm |

Strong blue luminescence was observed having the maximum intensity at a position about 1 cm from the point where the gases were merged into one stream. After introduction of the gases for 10 minutes, an A-Si:H:F:Cl film with a thickness of about 1.9 μm was deposited on the quartz glass substrate. This film was confirmed to be amorphous by electron beam diffraction.

After an aluminum comb-shaped electrode (gap length 200 m) was vapor deposited in vacuo on the A-Si:H:F:Cl film, the sample 8C was placed in a vacuum cryostat, and dark electroconductivity ($\sigma d$), and electroconductivity ($\sigma p$) when irradiated with light of 600 nm and 0.3 mw/cm² and the optical band gap by measurement of optical absorption ($Eg^{opt}$) were measured, respectively.

The obtained values were as follows:

$\sigma d = 6 \times 10^{-11}$ s/cm $\sigma p = 8 \times 10^{-7}$ s/cm $Eg^{opt} = 1.70$ eV

EXAMPLE 37

In Example 29, film formation was conducted by setting the substrate temperature at 600° C. (Sample 9C).

The film forming conditions in this case are as follows:

| | |
|---|---|
| SiH₄ | 20 sccm |
| F₂/He (15% F₂) | 1000 sccm |
| Inner pressure | 450 mTorr |
| Distance between gas blowing outlet and substrate | 5 cm |

Similarly as in Example 29, strong blue luminescence was observed having the maximum intensity at a point about 2 cm from the point where the SiH₄ gas and F₂ gas were merged into one stream. After introduction of the gases for 30 minutes, an A-Si:H:F film with a thickness of about 1.2 μm was deposited on the quartz glass substrate. When the deposited film was measured by electron beam diffraction, diffraction peak of Si was observed to indicate that it was polycrystallized.

After an aluminum comb-shaped electrode (gap length 200 μm) was vapor deposited in vacuo on the A-Si:H:F film, the sample 9C was placed in a vacuum cryostat, and dark electroconductivity ($\sigma d$) and the optical band gap by measurement of optical absorption ($Eg^{opt}$) were measured, respectively.

The obtained values were as follows:

$\sigma d = 6 \times 10^{-3}$ s/cm $Eg^{opt} = 1.9$ eV

Example 38

In Example 29, film formation was conducted by introducing SnH₄ gas from the 102 bomb simultaneously with introduction of SiH₄ gas (Sample 10C).

The film forming conditions in this case are as follows:

| | |
|---|---|
| SiH₄ | 20 sccm |
| SnH₄ | 5 sccm |
| F₂/He (5% F₂) | 1200 sccm |
| Inner pressure | 350 mTorr |
| Substrate temperature | 230° C. |
| Distance between gas blowing outlet and substrate | 5 cm |

Strong blue luminescence was observed having the maximum intensity at a position about 2 cm from the outlet of the gas blowing pipe. After introduction of the gases for 20 minutes, an A-SiSn:H:F film with a thickness of about 1.9 μm was depositied on the quartz glass substrate. This film was confirmed to be amorphous by electron beam diffraction.

After an aluminum comb-shaped electrode (gap length 200 μm) was vapor deposited in vacuo on the A-SiSn:H:F film, the sample 10C was placed in a vacuum cryostat, and dark electroconductivity ($\sigma d$) and electroconductivity ($\sigma d$) when irradiated with light of 600 nm and 0.3 mw/cm² were measured, respectively.

The obtained values were as follows:

$\sigma d = 2 \times 10^{-8}$ s/cm $\sigma p = 1 \times 10^{-7}$ s/cm

As can be seen from the detailed description and the respective examples as set forth above, according to the deposition film forming method of the present invention, easy management of film quality can be achieved simultaneously with achievement of energy saving. Further, functional deposited films having uniform characteristics over a large area can be obtained. Also, it is possible to obtain easily films excellent in productivity, bulk productivity, having high quality and excellent physical properties such as electrical, optical and semiconductor properties, etc.

We claim:

1. Method for forming a deposited film on a substrate in a film-forming space which comprises:

(a) conducting a gaseous starting material for forming a deposited film and a gaseous halogenic oxidizing agent selected from the group consisting of $F_2$, $Cl_2$, $Br_2$ and $I_2$ into the film-forming space;

(b) effecting chemical contact between said gaseous starting material and said gaseous halogenic oxidizing agent in said film-forming space to form a plural number of precursors containing precursors in an excited state, wherein at least one of said precursors is the feeding source of the constituent element of said deposited film; and (c) depositing said film on said substrate without the use of external discharge energy in said film-forming space, wherein the step of effecting chemical contact is implemented (i) by employing a gas introducing conduit system having multiple concentric tubular conduits extending into said film-forming space, in which exit orifices of inner ones of said conduits adapted to carry at least said gaseous starting material are set back from an exit orifice of the outer of said conduits adapted to carry said gaseous halogenic oxidizing agent in order to enable the gaseous halogenic oxidizing agent to surround said gaseous starting material during introduction thereof into said film-forming space; and (ii) by spacing said substrate from 5 millimeters to 15 centimeters from said gas introducing conduit system.

2. The method according to claim 1, wherein the film formation is accompanied with luminescence.

3. The method according to claim 1, wherein said gaseous starting material is a chain silane compound.

4. The method according to claim 3, wherein said chain silane compound is a straight chain silane compound.

5. The method according to claim 4, wherein said straight chain silane compound is represented by the general formula $Si_nH_{2n+2}$ (n is an integer of 1 to 8).

6. The method according to claim 3, wherein said chain silane compound is a branched chain silane compound.

7. The method according to claim 1, wherein said gaseous starting material is a silane compound haivng a cyclic structure of silicon.

8. The method according to claim 1, wherein said gaseous starting material is a chain germanium compound.

9. The method according to claim 8, wherein said chain germanium compound is represented by the general formula $Ge_mH_{2m+2}$ (m is an integer of 1 to 5).

10. The method according to claim 1, wherein said gaseous starting material is a hydrogenated tin compound.

11. The method according to claim 1, wherein said gaseous starting material is a tetrahedral type compound.

12. The method according to claim 1, wherein said substrate is arranged at a position opposed to the direction in which said gaseous starting material and said gaseous halogenic oxidizing agent are introduced into said reaction space.

13. The method according to claim 1, wherein said gaseous starting material and said gaseous halogenic oxidizing agent are introduced into said reaction space through a transporting pipe of a multi-tubular structure.

14. Method for forming a deposited film on a substrate in a film-forming space which comprises:

(a) conducting a gaseous starting material for forming a deposited film, a gaseous material (D) containing a component for valence electron control as a constituent, and a gaseous halogenic oxidizing agent selected from the group consisting of $F_2$, $Cl_2$, $Br_2$ and $I_2$ into the film-forming space;

(b) effecting chemical contact between said gaseous starting material, said gaseous material (D) containing a component for valence electron control as the constituent and said gaseous halogenic oxidizing agent in said film-forming space to form a plural number of precursors containing precursors in an excited state, wherein at least one of said precursors is the feeding source of the constituent element of said deposited film; and (c) depositing said film on said substrate without the use of external discharge energy in said film-forming space, wherein the step of effecting chemical contact is implemented (i) by employing a gas introducing conduit system having multiple concentric tubular conduits extending into said film-forming space, in which exit orifices of inner ones of said conduits adapted to carry said gaseous starting material and said gaseous material (D) containing a component for valence electron control as the constituent, respectively, are set back from the exit orifice of the outer of said conduits adapted to carry said gaseous halogenic oxidizing agent in order to enable the gaseous halogenic oxidizing agent to surround at least said gaseous starting material during introduction thereof into said film-forming space; and (ii) by spacing said substrate from 5 millimeters to 15 centimeters from the gas introducing conduit system.

15. The method according to claim 14, wherein the film formation is accompanied with luminescence.

16. The method according to claim 14, wherein said gaseous starting material is a chain silane compound.

17. The method according to claim 16, wherein said chain silane compound is a straight chain silane compound.

18. The method according to claim 17, wherein said straight chain silane compound is represented by the general formula $Si_nH_{2n+2}$ (n is an integer of 1 to 8).

19. The method according to claim 16, wherein said chain silane compound is a branched chain silane compound.

20. The method according to claim 14, wherein said gaseous starting material is a silane compound having a cyclic structure of silicon.

21. The method according to claim 14, wherein said gaseous starting material is a chain germanium compound.

22. The method according to claim 21, wherein said chain germanium compound is represented by the general formula $Ge_mH_{2m+2}$ (m is an integer of 1 to 5).

23. The method according to claim 14, wherein said gaseous starting material is a hydrogenated tin compound.

24. The method according to claim 14, wherein said gaseous starting material is a tetrahedral type compound.

25. The method according to claim 14, wherein said substrate is arranged at a position opposed to the direction in which said gaseous starting material, said gaseous halogenic oxidizing agent and said gaseous material (D) are introduced into said reaction space.

26. The method according to claim 14, wherein said gaseous starting material, said gaseous halogenic oxidizing agent and said gaseous material (D) are introduced into said reaction space through a transporting pipe of a multi-tubular structure.

27. A method for forming a deposited film, which comprises: introducing a gaseous starting material for formation of a deposited film and a gaseous halogenic oxidizing agent having the property of a oxidation action on said gaseous starting material into a reaction space to effect chemical contact therebetween and thereby cause a chemical reaction accompanied by luminescence to occur resulting in the formation of a plural number of precursors containing precursors in an excited state; positioning a substrate in a region with an luminescent intensity not greater than 1/5 of the maximum intensity of said luminescence; and forming a deposited film on the substrate with the use of at least one of said precursors as the feeding source for a constituent element of the deposited film.

28. The method according to claim 27, wherein said gaseous starting material is a chain silane compound.

29. The method according to claim 28, wherein said chain silane compound is a straight chain silane compound.

30. The method according to claim 29, wherein said straight chain silane compound is represented by the general formula $Si_nH_{2n+2}$ (n is an integer of 1 to 8).

31. The method according to claim 28, wherein said chain silane compound is a branched chain silane compound.

32. The method according to claim 27, wherein said gaseous starting material is a silane compound having a cyclic structure of silicon.

33. The method according to claim 27, wherein said gaseous starting material is a chain germanium compound.

34. The method according to claim 33, wherein said chain germanium compound is represented by the general formula $Ge_mH_{2m+2}$ (m is an integer of 1 to 5).

35. The method according to claim 27, wherein said gaseous starting material is a hydrogenated tin compound.

36. The method according to claim 27, wherein said gaseous starting material is a tetrahedral type compound.

37. The method according to claim 27, wherein said gaseous halogenic oxidizing agent contains fluorine gas.

38. The method according to claim 27, wherein said gaseous halogenic oxidizing agent contains chlorine gas.

39. The method according to claim 27, wherein said gaseous halogenic oxidizing agent is a gas containing fluorine atoms as the constituents.

40. The method according to claim 27, wherein said gaseous halogenic oxidizing agent contains a halogen under nascent state.

41. The method according to claim 27, wherein said substrate is arranged at a position opposed to the direction in which said gaseous starting material and said gaseous halogenic oxidizing agent are introduced into said reaction space.

42. The method according to claim 27, wherein said gaseous starting material and said gaseous halogenic oxidizing agent are introduced into said reaction space through a transporting pipe of a multi-tubular structure.

* * * * *